US010855906B2

(12) United States Patent
Lee

(10) Patent No.: US 10,855,906 B2
(45) Date of Patent: Dec. 1, 2020

(54) CAMERA APPARATUS FOR VEHICLE, AND VEHICLE

(71) Applicant: LG ELECTRONICS INC., Seoul (KR)

(72) Inventor: Manhyung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/474,462

(22) PCT Filed: May 8, 2017

(86) PCT No.: PCT/KR2017/004770
§ 371 (c)(1),
(2) Date: Jun. 27, 2019

(87) PCT Pub. No.: WO2018/124403
PCT Pub. Date: May 7, 2018

(65) Prior Publication Data
US 2019/0349516 A1    Nov. 14, 2019

(30) Foreign Application Priority Data
Dec. 28, 2016  (KR) ........................ 10-2016-0180860

(51) Int. Cl.
*H04N 5/232* (2006.01)
*B60R 1/00* (2006.01)
*G02B 27/09* (2006.01)
*H04N 5/225* (2006.01)
(Continued)

(52) U.S. Cl.
CPC ........... *H04N 5/23212* (2013.01); *B60R 1/00* (2013.01); *G02B 27/0955* (2013.01); *H04N 5/2254* (2013.01); *H04N 5/23296* (2013.01); *H04N 5/265* (2013.01); *H04N 5/335* (2013.01); *B60R 2300/105* (2013.01); *B60R 2300/30* (2013.01); *B60R 2300/60* (2013.01)

(58) Field of Classification Search
CPC ........... H04N 5/23212; H04N 5/23296; H04N 5/265; H04N 5/335; H04N 5/2257; H04N 5/2252; H04N 5/2253; H04N 5/2258; B60R 1/00; B60R 2300/105; B60R 2300/30; B60R 2300/60; G02B 27/0955; H05K 1/0204
See application file for complete search history.

(56) References Cited

U.S. PATENT DOCUMENTS 5,172,235 A * 12/1992 Wilm .................... G03B 15/00
348/149
9,550,455 B2 * 1/2017 Foley ................. H04N 5/23212
(Continued)

*Primary Examiner* — Richard A Hansell, Jr.
(74) *Attorney, Agent, or Firm* — Lee, Hong, Degerman, Kang & Waimey PC

(57) ABSTRACT

The present invention relates to a vehicle camera device comprising: a lens unit for inducing respective focal lengths of a plurality of image acquisition regions, divided in the horizontal direction, to be different from each other; an image sensor including a plurality of pixel arrays formed to correspond to the plurality of image acquisition regions, and converting, into an electrical signal, light introduced into each of the plurality of pixel arrays through the lens unit; and a processor for generating an image on the basis of the electrical signal.

19 Claims, 22 Drawing Sheets

(51) Int. Cl.
*H04N 5/265* (2006.01)
*H04N 5/335* (2011.01)

(56) References Cited

U.S. PATENT DOCUMENTS

| | | | |
|---|---|---|---|
| 2004/0021853 A1* | 2/2004 | Stam | G01J 1/32 |
| | | | 356/218 |
| 2006/0266835 A1* | 11/2006 | Tanida | B60R 11/04 |
| | | | 235/462.01 |
| 2010/0277935 A1* | 11/2010 | Endo | G08G 1/04 |
| | | | 362/466 |
| 2011/0267507 A1* | 11/2011 | Kane | G06T 7/571 |
| | | | 348/241 |
| 2018/0041721 A1* | 2/2018 | Lewkow | G02B 27/1013 |

\* cited by examiner

310a

CAMERA APPARATUS FOR VEHICLE, AND VEHICLE

CROSS-REFERENCE TO RELATED APPLICATIONS

This application is the National Stage filing under 35 U.S.C. 371 of International Application No. PCT/KR2017/004770, filed on May 8, 2017, which claims the benefit of earlier filing date and right of priority to Korean Application No. 10-2016-0180860, filed on Dec. 28, 2016, the contents of which are hereby incorporated by reference herein in its entirety.

BACKGROUND OF THE INVENTION

1. Field of the Invention

The present invention relates to a camera apparatus for a vehicle, and the vehicle.

2. Description of the Related Art

A vehicle is an apparatus that moves in a direction desired by a user riding therein. A representative example of a vehicle may be an automobile.

Meanwhile, a variety of sensors and electronic devices have been mounted in vehicles for the convenience of users. In particular, for user driving convenience, an Advanced Driver Assistance System (ADAS) has been actively studied. In addition, enormous efforts have been being made to develop autonomous vehicles.

Meanwhile, in order to implement the ADAS and the autonomous vehicle, a variety of sensors are provided in a vehicle. In particular, a camera apparatus is critical and essential to implement the ADAS and the autonomous vehicle.

The camera apparatus may be provided in plural in the vehicle. For example, a vehicle may include a long-range camera and a short-range camera to photograph images of an area in front of the vehicle. The long-range camera requires a lens having a narrow field of view (FOV) and a great magnification, and the short-range camera requires a wide-angle lens. Therefore, both of the long-distance camera and the short-distance camera are needed.

If a plurality of cameras is included, the vehicle's price will increase and inner space of the vehicle will be occupied more. In addition, the processor will be burdened more to process images acquired by the plurality of cameras.

SUMMARY OF THE INVENTION

The present invention has been made in view of the above problems, and it is one object of the present invention to provide a camera apparatus for a vehicle, the apparatus capable of acquiring both a long-range image and a short-range image.

It is another object of the present invention to provide a camera apparatus for a vehicle.

Objects of the present invention should not be limited to the aforementioned objects and other unmentioned objects will be clearly understood by those skilled in the art from the following description.

In accordance with an embodiment of the present invention, the above and other objects can be accomplished by the provision of a camera apparatus for a vehicle, the apparatus including: a lens unit causing a plurality of image acquisition regions differentiated in a horizontal direction to have different focal lengths; a plurality of pixel arrays corresponding to the plurality of image acquisition regions; an image sensor configured to convert light incident on each of the plurality of pixel arrays through the lens unit into an electrical signal; and a processor configured to generate an image based on the electrical signal.

The details of other embodiments are included in the following description and the accompanying drawings.

The embodiments of the present invention have one or more effects as follows.

First, there is an advantageous effect to enable long-range recognition and short-range recognition using one camera.

Second, there is an advantageous effect to minimize the number of pixels of an image sensor and size thereof, thereby reducing manufacturing costs of a camera apparatus for a vehicle.

Third, there is an advantageous effect to reduce volume of the camera apparatus, thereby securing a more inner space of the vehicle.

Fourth, there is an advantageous effect to re-use an existing algorithm that has been already developed.

Effects of the present invention should not be limited to the aforementioned effects and other unmentioned effects will be clearly understood by those skilled in the art from the claims.

DETAILED DESCRIPTION OF THE PREFERRED EMBODIMENTS

Figure 1:
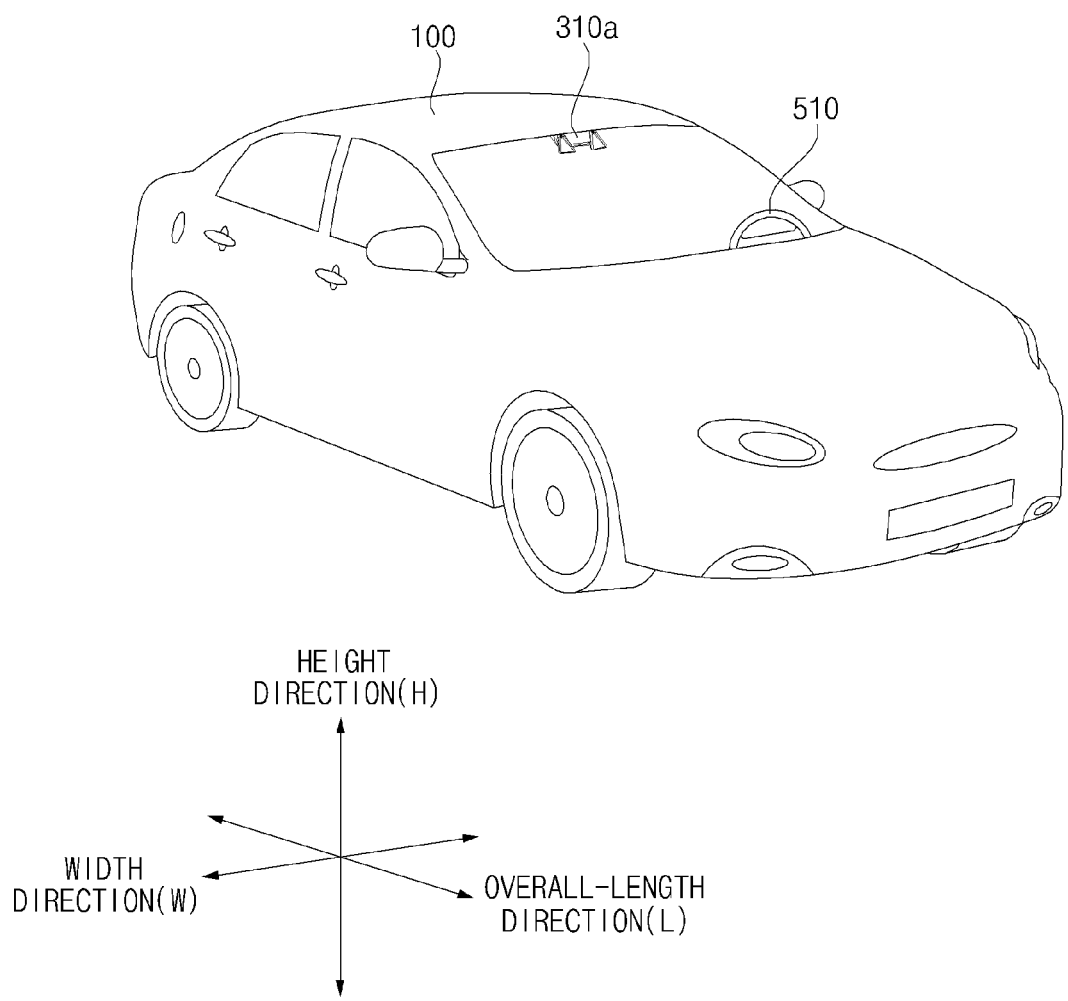
FIG. 1 is a view illustrating the external appearance of a vehicle according to an embodiment of the present invention.

Hereinafter, the embodiments disclosed in the present specification will be described in detail with reference to the accompanying drawings, and the same or similar elements are denoted by the same reference numerals even though they are depicted in different drawings and redundant descriptions thereof will be omitted. In the following description, with respect to constituent elements used in the following description, the suffixes "module" and "unit" are used or combined with each other only in consideration of ease in the preparation of the specification, and do not have or serve as different meanings. Accordingly, the suffixes "module" and "unit" may be interchanged with each other. In addition, in the following description of the embodiments disclosed in the present specification, a detailed description of known functions and configurations incorporated herein will be omitted when it may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present invention.

It will be understood that although the terms "first," "second," etc., may be used herein to describe various components, these components should not be limited by these terms. These terms are only used to distinguish one component from another component.

It will be understood that when a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise.

In the present application, it will be further understood that the terms "comprises", includes," etc. specify the presence of stated features, integers, steps, operations, elements, components, or combinations thereof, but do not preclude the presence or addition of one or more other features, integers, steps, operations, elements, components, or combinations thereof.

A vehicle as described in this specification may include an automobile and a motorcycle. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

FIG. 1 is a view of the external appearance of a vehicle according to an embodiment of the present invention.

Figure 2:
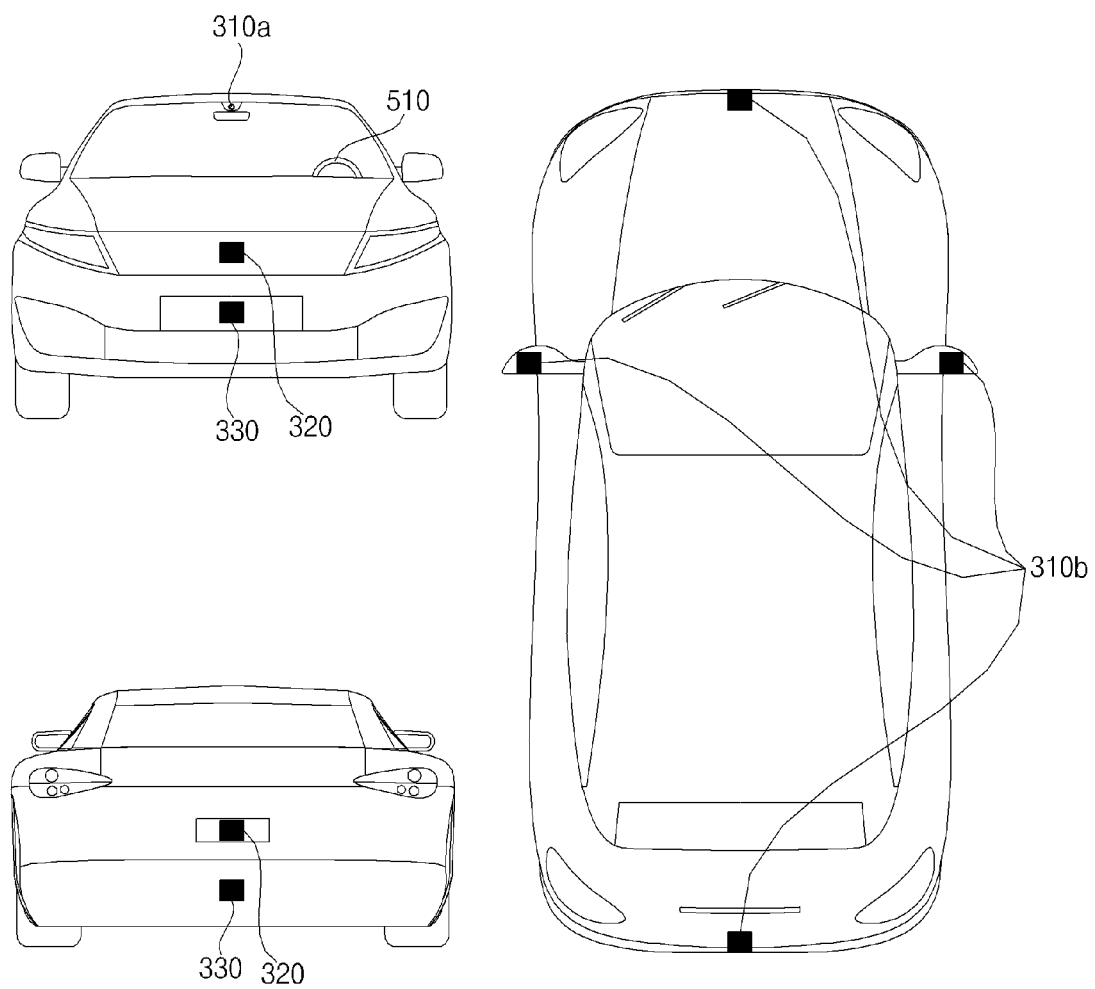
FIG. 2 are different angled views of the external appearance of a vehicle according to an embodiment of the present invention.

FIG. 2 is different angled views of a vehicle according to an embodiment of the present invention.

Figure 3:
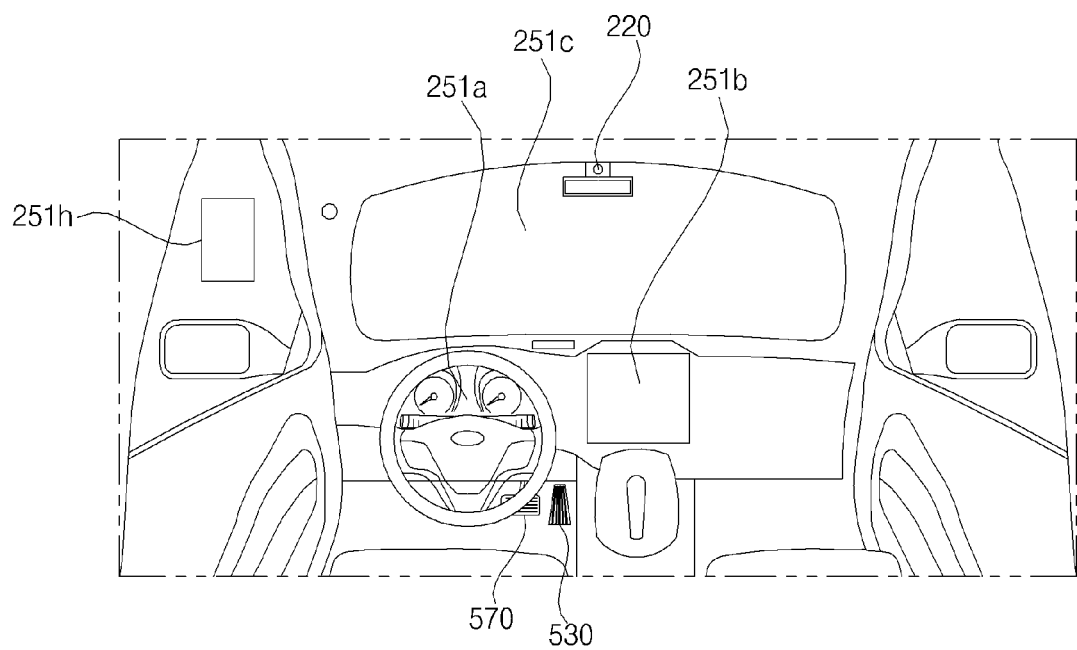
FIGS. 3 and 4 are views illustrating the interior configuration of a vehicle according to an embodiment of the present invention.
Figure 4:
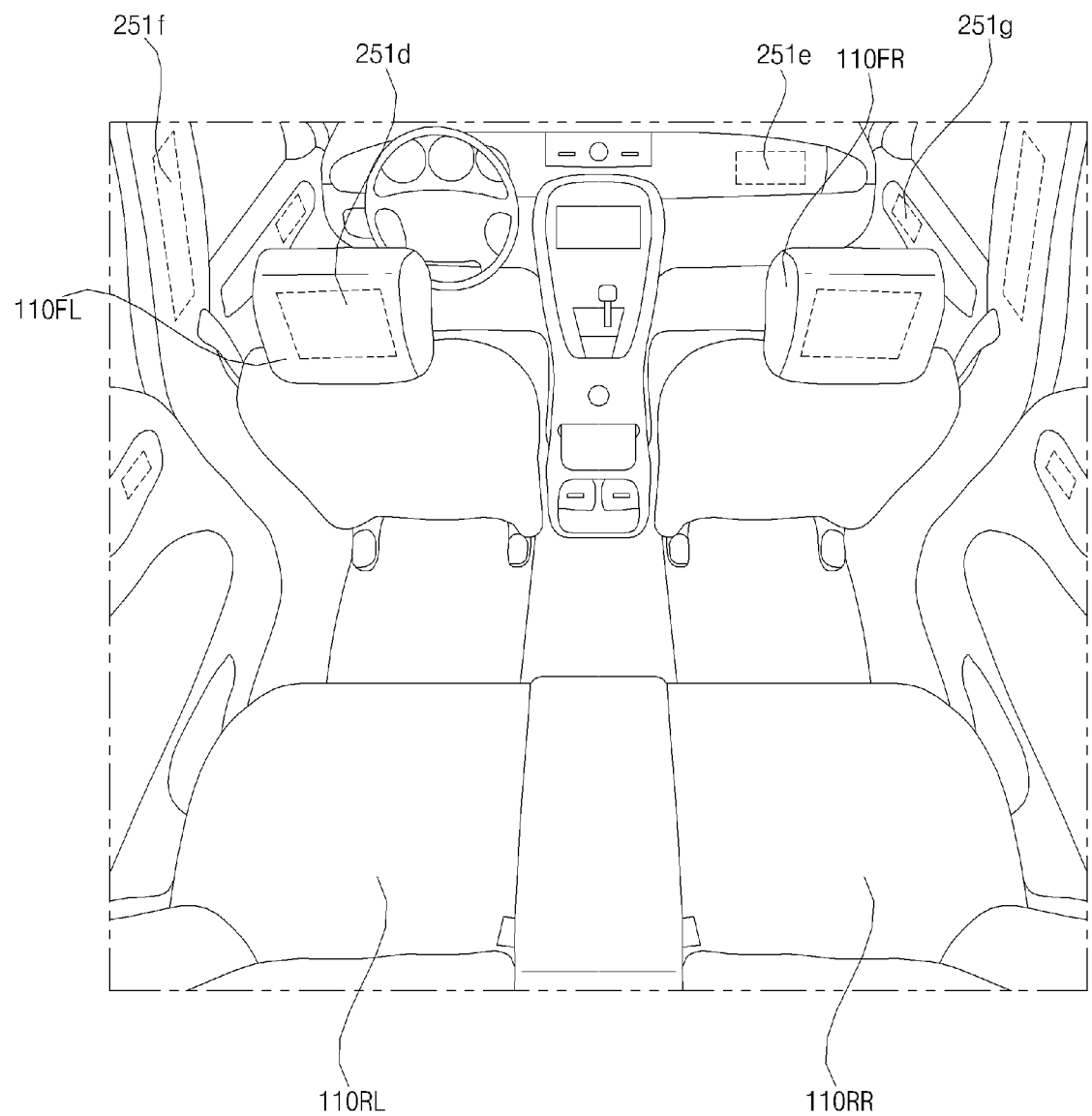

FIGS. 3 and 4 are views of the internal configuration of a vehicle according to an embodiment of the present invention.

Figure 5:
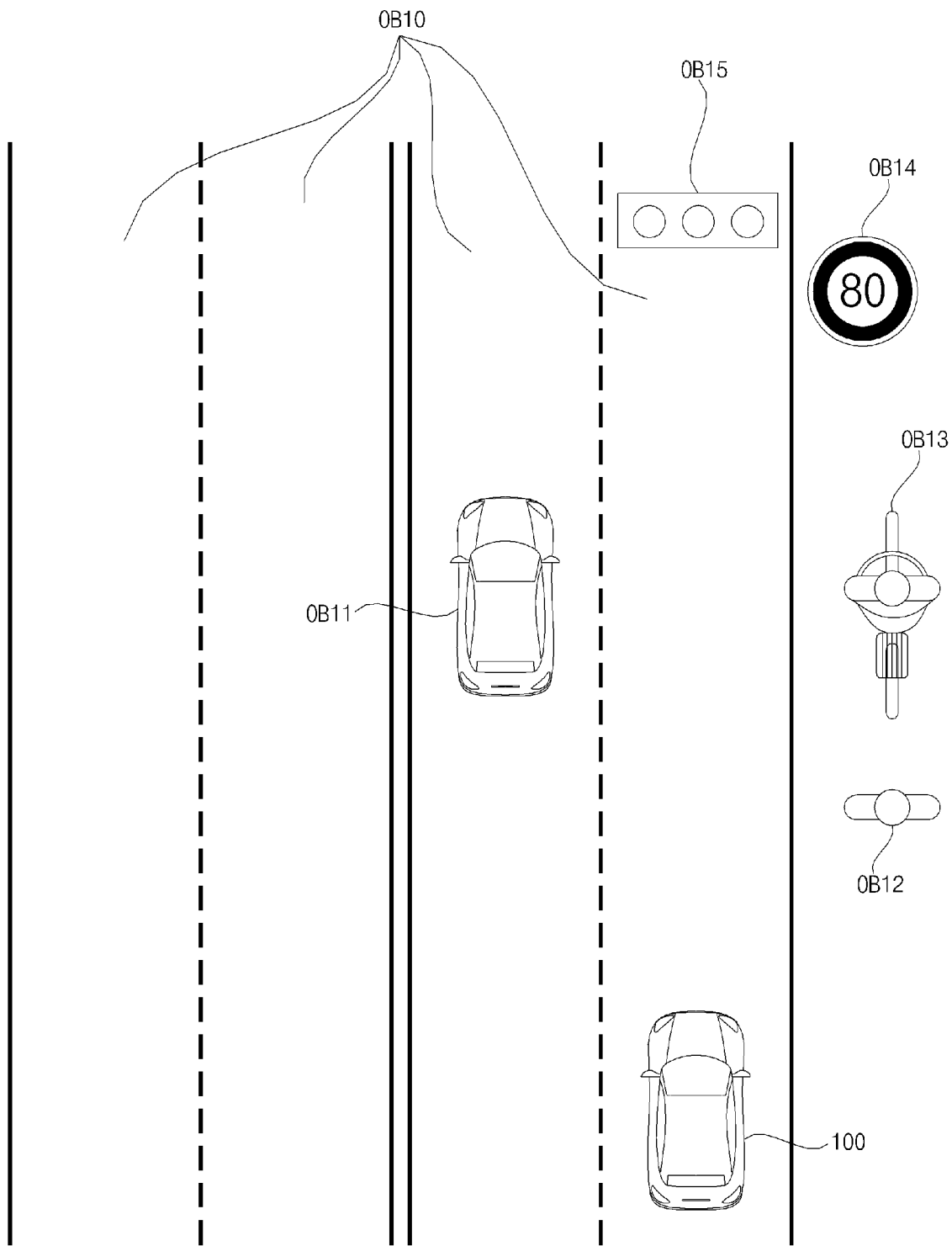
FIGS. 5 and 6 are views for explanation of an object according to an embodiment of the present invention.
Figure 6:
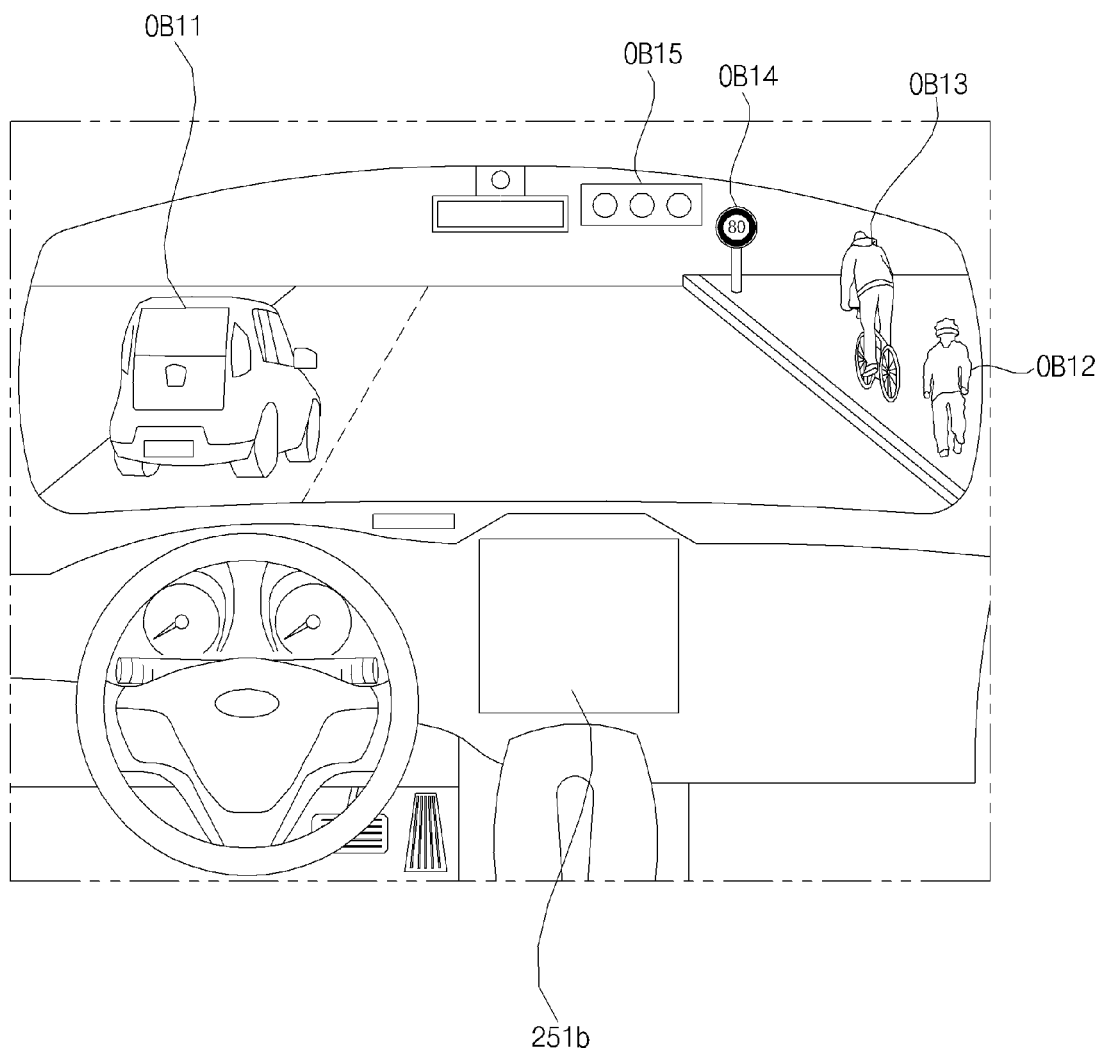

FIGS. 5 and 6 are views for explanation of objects according to an embodiment of the present invention.

Figure 7:
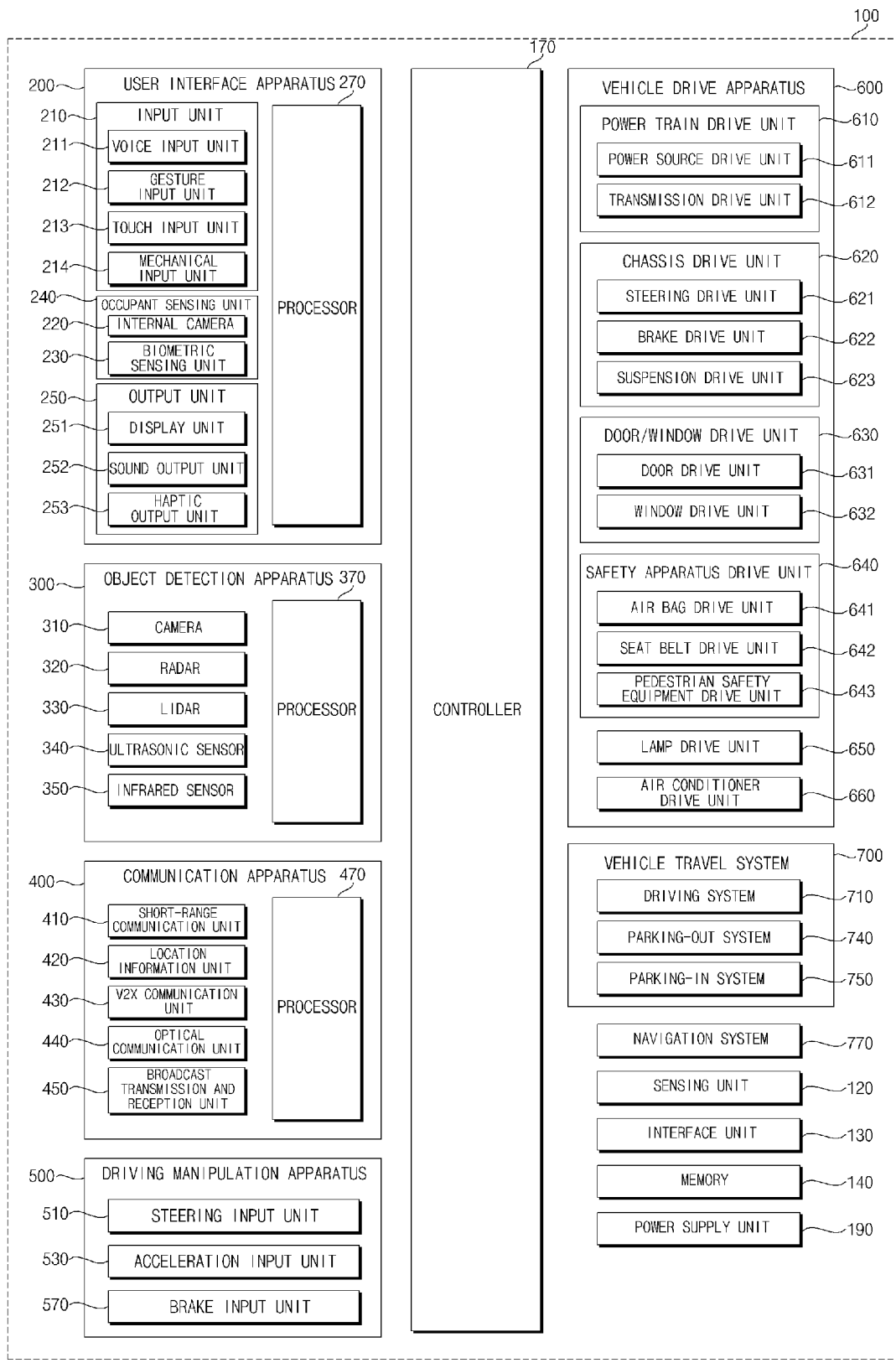
FIG. 7 is a block diagram illustrating a vehicle according to an embodiment of the present invention.

FIG. 7 is a block diagram illustrating a vehicle according to an embodiment of the present invention.

Referring to FIGS. 1 to 7, a vehicle 100 may include a plurality of wheels, which are rotated by a power source, and a steering input device 510 for controlling a driving direction of the vehicle 100.

The vehicle 100 may be an autonomous vehicle.

The vehicle 100 may be switched to an autonomous driving mode or a manual mode in response to a user input.

For example, in response to a user input received through a user interface apparatus 200, the vehicle 100 may be switched from a manual mode to an autonomous driving mode, or vice versa.

The vehicle 100 may be switched to the autonomous driving mode or to the manual mode based on driving situation information.

The driving situation information may include at least one of the following: information on an object located outside the vehicle 100, navigation information, and vehicle state information.

For example, the vehicle 100 may be switched from the manual mode to the autonomous driving mode, or vice versa, based on driving situation information generated by the object detection device 300.

In another example, the vehicle 100 may be switched from the manual mode to the autonomous driving mode, or vice versa, based on driving situation information received through a communication device 400.

The vehicle 100 may be switched from the manual mode to the autonomous driving mode, or vice versa, based on information, data, and a signal provided from an external device.

When the vehicle 100 operates in the autonomous driving mode, the autonomous vehicle 100 may operate based on an operation system 700.

For example, the autonomous vehicle 100 may operate based on information, data, or signals generated by a driving system 710, a parking-out system 740, and a parking-in system 750.

While operating in the manual mode, the autonomous vehicle 100 may receive a user input for driving of the vehicle 100 through a driving manipulation device 500. In response to the user input received through the driving manipulation device 500, the vehicle 100 may operate.

The term "overall length" means the length from the front end to the rear end of the vehicle 100, the term "width" means the width of the vehicle 100, and the term "height" means the height from the bottom of the wheel to the roof. In the following description, the term "overall length direction L" may mean the reference direction for the measurement of the overall length of the vehicle 100, the term "width direction W" may mean the reference direction for the measurement of the width of the vehicle 100, and the term "height direction H" may mean the reference direction for the measurement of the height of the vehicle 100.

As illustrated in FIG. 7, the vehicle 100 may include the user interface apparatus 200, the object detection device 300, the communication device 400, the driving manipulation device 500, a vehicle drive device 600, the operation system 700, a navigation system 770, a sensing unit 120, an interface 130, a memory 140, a controller 170, and a power supply unit 190.

In some embodiments, the vehicle 100 may further include other components in addition to the aforementioned components, or may not include some of the aforementioned components.

The user interface apparatus 200 is provided to support communication between the vehicle 100 and a user. The user interface apparatus 200 may receive a user input, and provide information generated in the vehicle 100 to the user. The vehicle 100 may enable User Interfaces (UI) or User Experience (UX) through the user interface apparatus 200.

The user interface apparatus 200 may include an input unit 210, an internal camera 220, a biometric sensing unit 230, an output unit 250, and a processor 270.

In some embodiments, the user interface apparatus 200 may further include other components in addition to the aforementioned components, or may not include some of the aforementioned components.

The input unit 210 is configured to receive information from a user, and data collected in the input unit 210 may be analyzed by the processor 270 and then processed into a control command of the user.

The input unit 210 may be disposed inside the vehicle 100. For example, the input unit 210 may be disposed in a region of a steering wheel, a region of an instrument panel, a region of a seat, a region of each pillar, a region of a door, a region of a center console, a region of a head lining, a region of a sun visor, a region of a windshield, or a region of a window.

The input unit 210 may include a voice input unit 211, a gesture input unit 212, a touch input unit 213, and a mechanical input unit 214.

The voice input unit 211 may convert a voice input of a user into an electrical signal. The converted electrical signal may be provided to the processor 270 or the controller 170.

The voice input unit 211 may include one or more microphones.

The gesture input unit 212 may convert a gesture input of a user into an electrical signal. The converted electrical signal may be provided to the processor 270 or the controller 170.

The gesture input unit 212 may include at least one selected from among an infrared sensor and an image sensor for sensing a gesture input of a user.

In some embodiments, the gesture input unit 212 may sense a three-dimensional (3D) gesture input of a user. To this end, the gesture input unit 212 may include a plurality of light emitting units for outputting infrared light, or a plurality of image sensors.

The gesture input unit 212 may sense the 3D gesture input by employing a Time of Flight (TOF) scheme, a structured light scheme, or a disparity scheme.

The touch input unit 213 may convert a user's touch input into an electrical signal. The converted electrical signal may be provided to the processor 270 or the controller 170.

The touch input unit 213 may include a touch sensor for sensing a touch input of a user.

In some embodiments, the touch input unit 210 may be formed integral with a display unit 251 to implement a touch screen. The touch screen may provide an input interface and an output interface between the vehicle 100 and the user.

The mechanical input unit 214 may include at least one selected from among a button, a dome switch, a jog wheel, and a jog switch. An electrical signal generated by the mechanical input unit 214 may be provided to the processor 270 or the controller 170.

The mechanical input unit 214 may be located on a steering wheel, a center fascia, a center console, a cockpit module, a door, etc.

The internal camera 220 may acquire images of the inside of the vehicle 100. The processor 270 may sense a user's condition based on the images of the inside of the vehicle 100. The processor 270 may acquire information on an eye gaze of the user. The processor 270 may sense a gesture of the user from the images of the inside of the vehicle 100.

The biometric sensing unit 230 may acquire biometric information of the user. The biometric sensing unit 230 may include a sensor for acquire biometric information of the user, and may utilize the sensor to acquire finger print information, heart rate information, etc. of the user. The biometric information may be used for user authentication.

The output unit 250 is configured to generate a visual, audio, or tactile output.

The output unit 250 may include at least one selected from among a display unit 251, a sound output unit 252, and a haptic output unit 253.

The display unit 251 may display graphic objects corresponding to various types of information.

The display unit 251 may include at least one selected from among a Liquid Crystal Display (LCD), a Thin Film Transistor-Liquid Crystal Display (TFT LCD), an Organic Light-Emitting Diode (OLED), a flexible display, a 3D display, and an e-ink display.

The display unit 251 may form an inter-layer structure together with the touch input unit 213, or may be integrally formed with the touch input unit 213 to implement a touch screen.

The display unit 251 may be implemented as a Head Up Display (HUD). When implemented as a HUD, the display unit 251 may include a projector module in order to output information through an image projected on a windshield or a window.

The display unit 251 may include a transparent display. The transparent display may be attached on the windshield or the window.

The transparent display may display a predetermined screen with a predetermined transparency. In order to achieve the transparency, the transparent display may include at least one selected from among a transparent Thin Film Electroluminescent (TFEL) display, an Organic Light Emitting Diode (OLED) display, a transparent Liquid Crystal Display (LCD), a transmissive transparent display, and a transparent Light Emitting Diode (LED) display. The transparency of the transparent display may be adjustable.

Meanwhile, the user interface apparatus 200 may include a plurality of display units 251*a* to 251*g*.

The display unit 251 may be disposed in a region of a steering wheel, a region 251*a*, 251*b*, or 251*e* of an instrument panel, a region 251*d* of a seat, a region 251*f* of each pillar, a region 251*g* of a door, a region of a center console, a region of a head lining, a region of a sun visor, a region 251*c* of a windshield, or a region 251*h* of a window.

The sound output unit 252 converts an electrical signal from the processor 270 or the controller 170 into an audio signal, and outputs the audio signal. To this end, the sound output unit 252 may include one or more speakers.

The haptic output unit 253 generates a tactile output. For example, the haptic output unit 253 may operate to vibrate a steering wheel, a safety belt, and seats 110FL, 110FR, 110RL, and 110RR so as to allow a user to recognize the output.

The processor 270 may control the overall operation of each unit of the user interface apparatus 200.

In some embodiments, the user interface apparatus 200 may include a plurality of processors 270 or may not include the processor 270.

In a case where the user interface apparatus 200 does not include the processor 270, the user interface apparatus 200 may operate under control of the controller 170 or a processor of a different device inside the vehicle 100.

Meanwhile, the user interface apparatus 200 may be referred to as a display device for vehicle.

The user interface apparatus 200 may operate under control of the controller 170.

The object detection device 300 is configured to detect an object outside the vehicle 100. The objection detection device 300 may generate information on the object based on sensing data.

The information on the object may include information about the presence of the object, location information of the object, information on a distance between the vehicle 100 and the object, and information on a speed of the vehicle relative to the object.

The object may include various objects related to travelling of the vehicle 100.

Referring to FIGS. 5 and 6, an object o may include a lane OB10, a nearby vehicle OB11, a pedestrian OB12, a two-wheeled vehicle OB13, a traffic signal OB14 and OB15, a light, a road, a structure, a bump, a geographical feature, an animal, etc.

The lane OB10 may be a lane in which the vehicle 100 is traveling, a lane next to the lane in which the vehicle 100 is traveling, or a lane in which a different vehicle is travelling in the opposite direction. The lane OB10 may include left and right lines that define the lane.

The nearby vehicle OB11 may be a vehicle that is travelling in the vicinity of the vehicle 100. The nearby vehicle OB11 may be a vehicle within a predetermined distance from the vehicle 100. For example, the nearby vehicle OB11 may be a vehicle that is preceding or following the vehicle 100.

The pedestrian OB12 may be a person in the vicinity of the vehicle 100. The pedestrian OB12 may be a person within a predetermined distance from the vehicle 100. For example, the pedestrian OB12 may be a person on a sidewalk or on the roadway.

The two-wheeled vehicle OB13 is a vehicle that is located in the vicinity of the vehicle 100 and moves with two wheels. The two-wheeled vehicle OB13 may be a vehicle that has two wheels within a predetermined distance from the vehicle 100. For example, the two-wheeled vehicle OB13 may be a motorcycle or a bike on a sidewalk or the roadway.

The traffic signal may include a traffic light OB15, a traffic sign plate OB14, and a pattern or text painted on a road surface.

The light may be light generated by a lamp provided in the nearby vehicle. The light may be light generated by a street light. The light may be solar light.

The road may include a road surface, a curve, and slopes, such as an upward slope and a downward slope.

The structure may be a body located around the road in the state of being fixed onto the ground. For example, the structure may include a streetlight, a roadside tree, a building, a traffic light, and a bridge.

The geographical feature may include a mountain and a hill.

Meanwhile, the object may be classified as a movable object or a stationary object. For example, the movable object may include a nearby vehicle and a pedestrian. For example, the stationary object may include a traffic signal, a road, and a structure.

The object detection device 300 may include a camera 310, a radar 320, a lidar 330, an ultrasonic sensor 340, an infrared sensor 350, and a processor 370.

In some embodiments, the object detection device 300 may further include other components in addition to the aforementioned components, or may not include some of the aforementioned components.

The camera 310 may be located at an appropriate position outside the vehicle 100 in order to acquire images of the outside of the vehicle 100. The camera 310 may be a mono camera, a stereo camera 310a, an Around View Monitoring (AVM) camera 310b, or a 360-degree camera.

Using various image processing algorithms, the camera 310 may acquire location information of an object, information on a distance to the object, and information on speed relative to the object.

For example, based on change in size over time of an object in acquired images, the camera 310 may acquire information on a distance to the object and information on speed relative to the object.

For example, the camera 310 may acquire the information on a distance to the object and the information on speed relative to the object, by utilizing a pin hole model or profiling a road surface.

For example, the camera 310 may acquire the information on a distance to the object and the information on the speed relative to the object, based on information on disparity in stereo images acquired by a stereo camera 310a.

For example, the camera 310 may be disposed near a front windshield in the vehicle 100 in order to acquire images of the front of the vehicle 100. Alternatively, the camera 310 may be disposed around a front bumper or a radiator grill.

In another example, the camera 310 may be disposed near a rear glass in the vehicle 100 in order to acquire images of the rear of the vehicle 100. Alternatively, the camera 310 may be disposed around a rear bumper, a trunk, or a tailgate.

In yet another example, the camera 310 may be disposed near at least one of the side windows in the vehicle 100 in order to acquire images of the side of the vehicle 100. Alternatively, the camera 310 may be disposed around a side mirror, a fender, or a door.

The camera 310 may provide an acquired image to the processor 370.

The radar 320 may include an electromagnetic wave transmission unit and an electromagnetic wave reception unit. The radar 320 may be realized as a pulse radar or a continuous wave radar depending on the principle of emission of an electronic wave. In addition, the radar 320 may be realized as a Frequency Modulated Continuous Wave (FMCW) type radar or a Frequency Shift Keying (FSK) type radar depending on the waveform of a signal.

The radar 320 may detect an object through the medium of an electromagnetic wave by employing a time of flight (TOF) scheme or a phase-shift scheme, and may detect a location of the detected object, the distance to the detected object, and the speed relative to the detected object The radar 320 may be located at an appropriate position outside the vehicle 100 in order to sense an object located in front of the vehicle 100, an object located to the rear of the vehicle 100, or an object located to the side of the vehicle 100.

The lidar 330 may include a laser transmission unit and a laser reception unit. The lidar 330 may be implemented by the TOF scheme or the phase-shift scheme.

The lidar 330 may be implemented as a drive type lidar or a non-drive type lidar.

When implemented as the drive type lidar, the lidar 300 may rotate by a motor and detect an object in the vicinity of the vehicle 100.

When implemented as the non-drive type lidar, the lidar 300 may utilize a light steering technique to detect an object located within a predetermined distance from the vehicle 100.

The lidar 330 may detect an object through the medium of laser light by employing the TOF scheme or the phase-shift scheme, and may detect a location of the detected object, the distance to the detected object, and the speed relative to the detected object.

The lidar 330 may be located at an appropriate position outside the vehicle 100 in order to sense an object located in front of the vehicle 100, an object located to the rear of the vehicle 100, or an object located to the side of the vehicle 100.

The ultrasonic sensor 340 may include an ultrasonic wave transmission unit and an ultrasonic wave reception unit. The ultrasonic sensor 340 may detect an object based on an ultrasonic wave, and may detect a location of the detected object, the distance to the detected object, and the speed relative to the detected object.

The ultrasonic sensor 340 may be located at an appropriate position outside the vehicle 100 in order to detect an object located in front of the vehicle 100, an object located to the rear of the vehicle 100, and an object located to the side of the vehicle 100.

The infrared sensor 350 may include an infrared light transmission unit and an infrared light reception unit. The infrared sensor 340 may detect an object based on infrared light, and may detect a location of the detected object, the distance to the detected object, and the speed relative to the detected object.

The infrared sensor 350 may be located at an appropriate position outside the vehicle 100 in order to sense an object located in front of the vehicle 100, an object located to the rear of the vehicle 100, or an object located to the side of the vehicle 100.

The processor 370 may control the overall operation of each unit of the object detection device 300.

The processor 370 may detect or classify an object by comparing pre-stored data with data sensed by the camera 310, the radar 320, the lidar 330, the ultrasonic sensor 340, and the infrared sensor 350.

The processor 370 may detect and track an object based on acquired images. The processor 370 may, for example, calculate the distance to the object and the speed relative to the object.

For example, the processor 370 may acquire information on the distance to the object and information on the speed relative to the object based on a variation in size over time of the object in acquired images.

In another example, the processor 370 may acquire information on the distance to the object or information on the speed relative to the object by employing a pin hole model or by profiling a road surface.

In yet another example, the processor 370 may acquire information on the distance to the object and information on the speed relative to the object based on information on disparity in stereo images acquired from the stereo camera 310*a*.

The processor 370 may detect and track an object based on a reflection electromagnetic wave which is formed as a result of reflection a transmission electromagnetic wave by the object. Based on the electromagnetic wave, the processor 370 may, for example, calculate the distance to the object and the speed relative to the object.

The processor 370 may detect and track an object based on a reflection laser light which is formed as a result of reflection of transmission laser by the object. Based on the laser light, the processor 370 may, for example, calculate the distance to the object and the speed relative to the object.

The processor 370 may detect and track an object based on a reflection ultrasonic wave which is formed as a result of reflection of a transmission ultrasonic wave by the object. Based on the ultrasonic wave, the processor 370 may, for example, calculate the distance to the object and the speed relative to the object.

The processor 370 may detect and track an object based on reflection infrared light which is formed as a result of reflection of transmission infrared light by the object. Based on the infrared light, the processor 370 may, for example, calculate the distance to the object and the speed relative to the object.

In some embodiments, the object detection device 300 may include a plurality of processors 370 or may not include the processor 370. For example, each of the camera 310, the radar 320, the lidar 330, the ultrasonic sensor 340, and the infrared sensor 350 may include its own processor.

In a case where the object detection device 300 does not include the processor 370, the object detection device 300 may operate under control of the controller 170 or a processor inside the vehicle 100.

The object detection device 300 may operate under control of the controller 170.

The communication device 400 is configured to perform communication with an external device. Here, the external device may be a nearby vehicle, a mobile terminal, or a server.

To perform communication, the communication device 400 may include at least one selected from among a transmission antenna, a reception antenna, a Radio Frequency (RF) circuit capable of implementing various communication protocols, and an RF device.

The communication device 400 may include a short-range communication unit 410, a location information unit 420, a V2X communication unit 430, an optical communication unit 440, a broadcast transmission and reception unit 450, an Intelligent Transport Systems (ITS) communication unit 460, and a processor 470.

In some embodiments, the communication device 400 may further include other components in addition to the aforementioned components, or may not include some of the aforementioned components.

The short-range communication unit 410 is configured to perform short-range communication. The short-range communication unit 410 may support short-range communication using at least one selected from among Bluetooth™, Radio Frequency IDdentification (RFID), Infrared Data Association (IrDA), Ultra-WideBand (UWB), ZigBee, Near Field Communication (NFC), Wireless-Fidelity (Wi-Fi), Wi-Fi Direct, and Wireless USB (Wireless Universal Serial Bus).

The short-range communication unit 410 may form wireless area networks to perform short-range communication between the vehicle 100 and at least one external device.

The location information unit 420 is configured to acquire location information of the vehicle 100. For example, the location information unit 420 may include a Global Positioning System (GPS) module or a Differential Global Positioning System (DGPS) module.

The V2X communication unit 430 is configured to perform wireless communication between a vehicle and a server (that is, vehicle to infra (V2I) communication), wireless communication between a vehicle and a nearby vehicle (that is, vehicle to vehicle (V2V) communication), or wireless communication between a vehicle and a pedestrian (that is, vehicle to pedestrian (V2P) communication).

The optical communication unit 440 is configured to perform communication with an external device through the medium of light. The optical communication unit 440 may include a light emitting unit, which converts an electrical signal into an optical signal and transmits the optical signal to the outside, and a light receiving unit which converts a received optical signal into an electrical signal.

In some embodiments, the light emitting unit may be integrally formed with a lamp provided included in the vehicle 100.

The broadcast transmission and reception unit 450 is configured to receive a broadcast signal from an external broadcasting management server or transmit a broadcast signal to the broadcasting management server through a broadcasting channel. The broadcasting channel may include a satellite channel, and a terrestrial channel. The broadcast signal may include a TV broadcast signal, a radio broadcast signal, and a data broadcast signal.

The ITS communication unit 460 may exchange information, data, or signals with a traffic system. The ITS communication unit 460 may provide acquired information or data to the traffic system. The ITS communication unit 460 may receive information, data, or signals from the traffic system. For example, the ITS communication unit 460 may receive traffic volume information from the traffic system and provide the traffic volume information to the controller 170. In another example, the ITS communication unit 460 may receive a control signal from the traffic system, and provide the control signal to the controller 170 or a processor provided in the vehicle 100.

The processor 470 may control the overall operation of each unit of the communication device 400.

In some embodiments, the communication device 400 may include a plurality of processors 470, or may not include the processor 470.

In a case where the communication device 400 does not include the processor 470, the communication device 400 may operate under control of the controller 170 or a processor of a device inside of the vehicle 100.

Meanwhile, the communication device 400 may implement a vehicle display device, together with the user interface apparatus 200. In this case, the vehicle display device may be referred to as a telematics device or an Audio Video Navigation (AVN) device.

The communication device 400 may operate under control of the controller 170.

The driving manipulation device 500 is configured to receive a user input for driving the vehicle 100.

In the manual mode, the vehicle 100 may operate based on a signal provided by the driving manipulation device 500.

The driving manipulation device 500 may include a steering input device 510, an acceleration input device 530, and a brake input device 570.

The steering input device 510 may receive a user input with regard to the direction of travel of the vehicle 100. The steering input device 510 may take the form of a wheel to enable a steering input through the rotation thereof. In some embodiments, the steering input device may be provided as a touchscreen, a touch pad, or a button.

The acceleration input device 530 may receive a user input for acceleration of the vehicle 100. The brake input device 570 may receive a user input for deceleration of the vehicle 100. Each of the acceleration input device 530 and the brake input device 570 may take the form of a pedal. In some embodiments, the acceleration input device or the break input device may be configured as a touch screen, a touch pad, or a button.

The driving manipulation device 500 may operate under control of the controller 170.

The vehicle drive device 600 is configured to electrically control the operation of various devices of the vehicle 100.

The vehicle drive device 600 may include a power train drive unit 610, a chassis drive unit 620, a door/window drive unit 630, a safety apparatus drive unit 640, a lamp drive unit 650, and an air conditioner drive unit 660.

In some embodiments, the vehicle drive device 600 may further include other components in addition to the aforementioned components, or may not include some of the aforementioned components.

Meanwhile, the vehicle drive device 600 may include a processor. Each unit of the vehicle drive device 600 may include its own processor.

The power train drive unit 610 may control the operation of a power train.

The power train drive unit 610 may include a power source drive unit 611 and a transmission drive unit 612.

The power source drive unit 611 may control a power source of the vehicle 100.

In the case in which a fossil fuel-based engine is the power source, the power source drive unit 611 may perform electronic control of the engine. As such the power source drive unit 611 may control, for example, the output torque of the engine. The power source drive unit 611 may adjust the output toque of the engine under control of the controller 170.

In a case where an electric motor is the power source, the power source drive unit 611 may control the motor. The power source drive unit 610 may control, for example, the RPM and toque of the motor under control of the controller 170.

The transmission drive unit 612 may control a transmission.

The transmission drive unit 612 may adjust the state of the transmission. The transmission drive unit 612 may adjust a state of the transmission to a drive (D), reverse (R), neutral (N), or park (P) state.

Meanwhile, in a case where an engine is the power source, the transmission drive unit 612 may adjust a gear-engaged state to the drive position D.

The chassis drive unit 620 may control the operation of a chassis.

The chassis drive unit 620 may include a steering drive unit 621, a brake drive unit 622, and a suspension drive unit 623.

The steering drive unit 621 may perform electronic control of a steering apparatus provided inside the vehicle 100. The steering drive unit 621 may change the direction of travel of the vehicle 100.

The brake drive unit 622 may perform electronic control of a brake apparatus provided inside the vehicle 100. For example, the brake drive unit 622 may reduce the speed of the vehicle 100 by controlling the operation of a brake located at a wheel.

Meanwhile, the brake drive unit 622 may control a plurality of brakes individually. The brake drive unit 622 may apply a different degree-braking force to each wheel.

The suspension drive unit 623 may perform electronic control of a suspension apparatus inside the vehicle 100. For example, when the road surface is uneven, the suspension drive unit 623 may control the suspension apparatus so as to reduce the vibration of the vehicle 100.

Meanwhile, the suspension drive unit 623 may control a plurality of suspensions individually.

The door/window drive unit 630 may perform electronic control of a door apparatus or a window apparatus inside the vehicle 100.

The door/window drive unit 630 may include a door drive unit 631 and a window drive unit 632.

The door drive unit 631 may control the door apparatus. The door drive unit 631 may control opening or closing of a plurality of doors included in the vehicle 100. The door drive unit 631 may control opening or closing of a trunk or a tail gate. The door drive unit 631 may control opening or closing of a sunroof.

The window drive unit 632 may perform electronic control of the window apparatus. The window drive unit 632 may control opening or closing of a plurality of windows included in the vehicle 100.

The safety apparatus drive unit 640 may perform electronic control of various safety apparatuses provided inside the vehicle 100.

The safety apparatus drive unit 640 may include an airbag drive unit 641, a safety belt drive unit 642, and a pedestrian protection equipment drive unit 643.

The airbag drive unit 641 may perform electronic control of an airbag apparatus inside the vehicle 100. For example, upon detection of a dangerous situation, the airbag drive unit 641 may control an airbag to be deployed.

The safety belt drive unit 642 may perform electronic control of a seatbelt apparatus inside the vehicle 100. For example, upon detection of a dangerous situation, the safety belt drive unit 642 may control passengers to be fixed onto seats 110FL, 110FR, 110RL, and 110RR with safety belts.

The pedestrian protection equipment drive unit 643 may perform electronic control of a hood lift and a pedestrian airbag. For example, upon detection of a collision with a pedestrian, the pedestrian protection equipment drive unit 643 may control a hood lift and a pedestrian airbag to be deployed.

The lamp drive unit 650 may perform electronic control of various lamp apparatuses provided inside the vehicle 100.

The air conditioner drive unit 660 may perform electronic control of an air conditioner inside the vehicle 100. For example, when the inner temperature of the vehicle 100 is high, an air conditioner drive unit 660 may operate the air conditioner so as to supply cool air to the inside of the vehicle 100.

The vehicle drive device 600 may include a processor. Each unit of the vehicle dive device 600 may include its own processor.

The vehicle drive device 600 may operate under control of the controller 170.

The operation system 700 is a system for controlling the overall driving operation of the vehicle 100. The operation system 700 may operate in the autonomous driving mode.

The operation system 700 may include the driving system 710, the parking-out system 740, and the parking-in system 750.

In some embodiments, the operation system 700 may further include other components in addition to the aforementioned components, or may not include some of the aforementioned component.

Meanwhile, the operation system 700 may include a processor. Each unit of the operation system 700 may include its own processor.

Meanwhile, in some embodiments, in a case where the operation system 700 is implemented as software, the operation system 700 may be a subordinate concept of the controller 170.

Meanwhile, in some embodiments, the operation system 700 may be a concept including at least one selected from among the user interface apparatus 270, the object detection device 300, the communication device 400, the driving manipulation device 500, the vehicle drive device 600, the navigation system 770, the sensing unit 120, and the controller 170.

The driving system 710 may perform driving of the vehicle 100.

The driving system 710 may perform driving of the vehicle 100 by providing a control signal to the vehicle drive device 600 in response to reception of navigation information from the navigation system 770.

The driving system 710 may perform driving of the vehicle 100 by providing a control signal to the vehicle drive device 600 based on information on an object received from the object detection device 300.

The driving system 710 may perform driving of the vehicle 100 by providing a control signal to the vehicle drive device 600 in response to reception of a signal from an external device through the communication device 400.

The driving system 710 may be a system which includes at least one of the user interface apparatus 270, the object detection device 300, the communication device 400, the driving manipulation device 500, the vehicle driving device 600, the navigation system 770, the sensing unit 120, and the controller 170, and which performs driving of the vehicle 100.

The driving system 710 may be referred to as a vehicle driving control apparatus.

The parking-out system 740 may perform an operation of pulling the vehicle 100 out of a parking space.

The parking-out system 740 may perform an operation of pulling the vehicle 100 out of a parking space, by providing a control signal to the vehicle drive device 600 in response to reception of navigation information from the navigation system 770.

The parking-out system 740 may perform an operation of pulling the vehicle 100 out of a parking space, by providing a control signal to the vehicle drive device 600 based on information on an object received from the object detection device 300.

The parking-out system 740 may perform an operation of pulling the vehicle 100 out of a parking space, by providing a control signal to the vehicle drive device 600 based on a signal received from an external device.

The parking-out system 740 may be a system which includes at least one of the user interface apparatus 270, the object detection device 300, the communication device 400, the driving manipulation device 500, the vehicle driving device 600, the navigation system 770, the sensing unit 120, and the controller 170, and which performs an operation of pulling the vehicle 100 out of a parking space.

The parking-out system 740 may be referred to as a vehicle parking-out control apparatus.

The parking-in system 750 may perform an operation of parking the vehicle 100 in a parking space.

The parking-in system 750 may perform an operation of parking the vehicle 100 in a parking space, by providing a control signal to the vehicle drive device 600 in response to reception of navigation information from the navigation system 770.

The parking-in system 750 may perform an operation of parking the vehicle 100 in a parking space, by providing a control signal to the vehicle drive device 600 based on information on an object received from the object detection device 300.

The parking-in system 750 may perform an operation of parking the vehicle 100 in a parking space, by providing a control signal to the vehicle drive device 600 in response to reception of a signal from an external device.

The parking-in system 750 may be a system which includes at least one of the user interface apparatus 270, the object detection device 300, the communication device 400, the driving manipulation device 500, the vehicle driving device 600, the navigation system 770, the sensing unit 120, and the controller 170, and which performs an operation of parking the vehicle 100.

The parking-in system 750 may be referred to as a vehicle parking control apparatus.

The navigation system 770 may provide navigation information. The navigation information may include at least one selected from among map information, information on a set destination, information on a route to the set destination, information on various objects along the route, lane information, and information on a current location of the vehicle.

The navigation system 770 may include a memory and a processor. The memory may store navigation information. The processor may control the operation of the navigation system 770.

In some embodiments, the navigation system 770 may update pre-stored information by receiving information from an external device through the communication device 400.

In some embodiments, the navigation system 770 may be classified as an element of the user interface apparatus 200.

The sensing unit 120 may sense the state of the vehicle. The sensing unit 120 may include an attitude sensor (for example, a yaw sensor, a roll sensor, or a pitch sensor), a collision sensor, a wheel sensor, a speed sensor, a gradient sensor, a weight sensor, a heading sensor, a gyro sensor, a position module, a vehicle forward/reverse movement sensor, a battery sensor, a fuel sensor, a tire sensor, a steering sensor based on the rotation of the steering wheel, an in-vehicle temperature sensor, an in-vehicle humidity sensor, an ultrasonic sensor, an illumination sensor, an accelerator pedal position sensor, and a brake pedal position sensor.

The sensing unit 120 may acquire sensing signals with regard to, for example, vehicle attitude information, vehicle collision information, vehicle driving direction information, vehicle location information (GPS information), vehicle angle information, vehicle speed information, vehicle acceleration information, vehicle tilt information, vehicle forward/reverse movement information, battery information, fuel information, tire information, vehicle lamp information, in-vehicle temperature information, in-vehicle humidity information, steering-wheel rotation angle information, out-of-vehicle illumination information, information about the pressure applied to an accelerator pedal, and information about the pressure applied to a brake pedal.

The sensing unit 120 may further include, for example, an accelerator pedal sensor, a pressure sensor, an engine speed sensor, an Air Flow-rate Sensor (AFS), an Air Temperature Sensor (ATS), a Water Temperature Sensor (WTS), a Throttle Position Sensor (TPS), a Top Dead Center (TDC) sensor, and a Crank Angle Sensor (CAS).

The sensing unit 120 may generate vehicle state information based on sensing data. The vehicle state information may be information that is generated based on data sensed by various sensors provided inside the vehicle 100.

For example, the vehicle state information may include vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, vehicle engine temperature information, etc.

The interface 130 may serve as a passage for various kinds of external devices that are connected to the vehicle 100. For example, the interface 130 may have a port that is connectable to a mobile terminal and may be connected to the mobile terminal via the port. In this case, the interface 130 may exchange data with the mobile terminal.

Meanwhile, the interface 130 may serve as a passage for the supply of electrical energy to a mobile terminal connected thereto. When the mobile terminal is electrically connected to the interface 130, the interface 130 may provide electrical energy, supplied from the power supply unit 190, to the mobile terminal under control of the controller 170.

The memory 140 is electrically connected to the controller 170. The memory 140 may store basic data for each unit, control data for the operational control of each unit, and input/output data. The memory 140 may be any of various hardware storage devices, such as a ROM, a RAM, an EPROM, a flash drive, and a hard drive. The memory 140 may store various data for the overall operation of the vehicle 100, such as programs for the processing or control of the controller 170.

In some embodiments, the memory 140 may be integrally formed with the controller 170, or may be provided as an element of the controller 170.

The controller 170 may control the overall operation of each unit inside the vehicle 100. The controller 170 may be referred to as an Electronic Controller (ECU).

The power supply unit 190 may supply power required to operate each component under control of the controller 170. In particular, the power supply unit 190 may receive power from, for example, a battery inside the vehicle 100.

One or more processors and the controller 170 included in the vehicle 100 may be implemented using at least one selected from among Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, and electric units for the implementation of other functions.

Figure 8A:
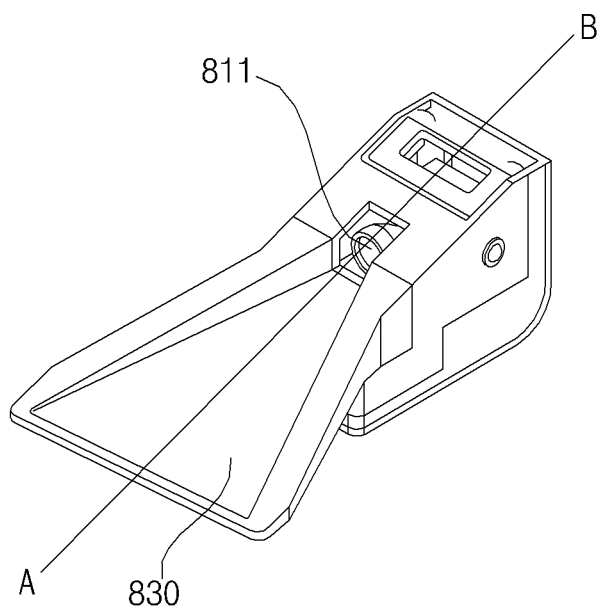
FIG. 8A is a perspective view of a camera for a vehicle according to an embodiment of the present invention.
Figure 8B:
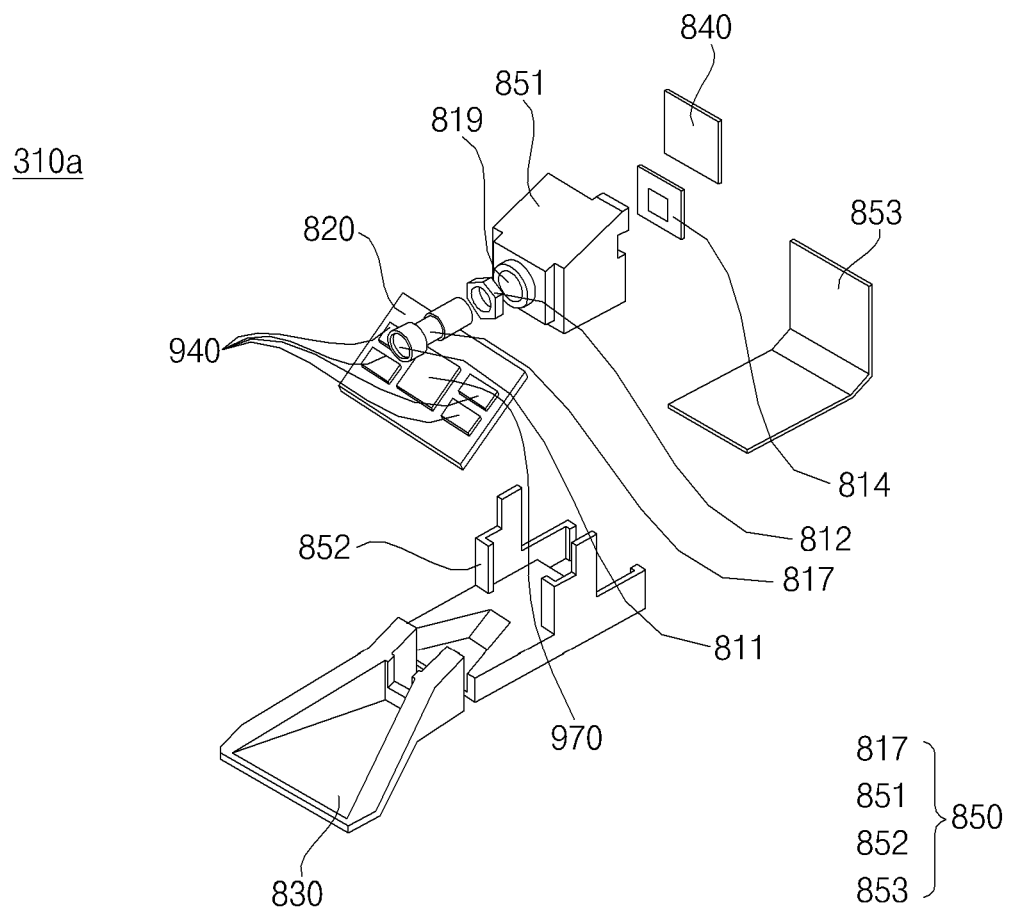
FIG. 8B is an exploded perspective view of a camera for a vehicle according to an embodiment of the present invention.
Figure 8C:
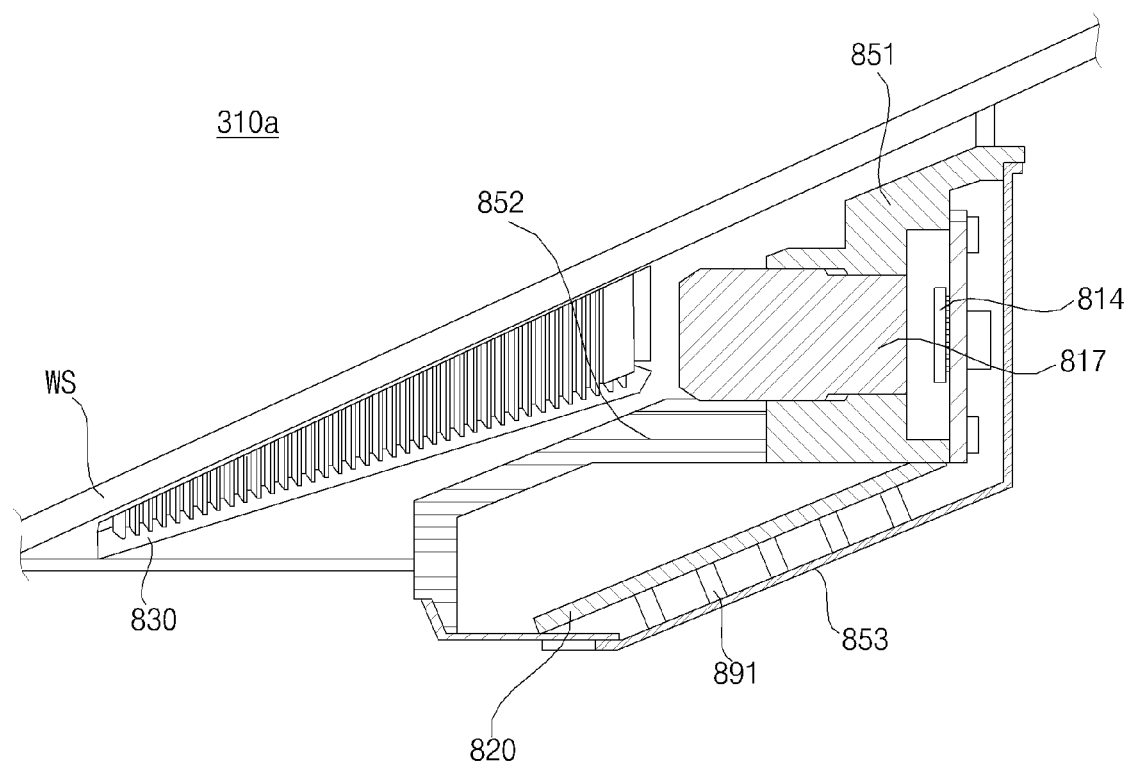
FIG. 8C is a cross-section view of a camera for a vehicle taken along line A-B of FIG. 8A according to an embodiment of the present invention.

FIG. 8A is a perspective view of a camera for a vehicle according to an embodiment of the present invention. FIG. 8B is an exploded perspective view of a camera for a vehicle according to an embodiment of the present invention. FIG. 8C is a cross-section view of a camera for a vehicle taken along line A-B of FIG. 8A according to an embodiment of the present invention.

A camera 310 for a vehicle, which will be described with reference to FIGS. 8A to 8C, is a single camera 310a.

The camera 310a may include a lens unit 811, an image sensor 814, and a processor 970.

In some embodiments, the camera 310a may further include a processing board 820, a light shield 830, a dissipation member 840, and a housing 250 individually or in combination.

Meanwhile, the housing 250 may include a first housing 851, a second housing 852, and a third housing 853.

The lens unit 811 may be fastened by a nut 812 while housed in the lens housing 817, such that the lens unit 811 is mounted into a hole 819 formed in a portion of the first housing 851.

The image sensor 814 may include at least one photoelectric transformation element capable of transforming an optical signal into an electrical signal. For example, the image sensor 814 may be a charge-coupled device (CCD) or a complimentary metal-oxide semiconductor (CMOS).

The image sensor 814 may be disposed at an appropriate position in the exterior or interior of the vehicle in order to acquire an image of an area outside the vehicle or an image of an area inside the vehicle.

For example, the image sensor 814 may be disposed adjacent to a front windshield (WS) within the interior of the vehicle in order to acquire a front-view image of the vehicle. Alternatively, the image sensor 814 may be disposed in the vicinity of a front bumper or a radiator grill.

For example, the image sensor 814 may be disposed adjacent to a rear windshield in the interior of the vehicle in order to acquire a rear-view image of the vehicle. Alternatively, the image sensor 814 may be disposed in the vicinity of a rear bumper, a trunk, or a tail gate.

For example, the image sensor 814 may be disposed adjacent to at least one side window in the interior of the vehicle in order to acquire a side-view image of the vehicle. Alternatively, the image sensor 814 may be disposed in the vicinity of a side mirror, a fender, or a door.

In order to acquire an image based on a light introduced through the lens unit 811, the image sensor 814 may be disposed behind the lens unit 811. For example, the image sensor 814 may be disposed vertically to the ground while spaced a predetermined distance from the lens unit 811.

A module including the lens unit 811 and the image sensor 814 may be referred to as an image acquisition module. The image acquisition module may be disposed at the ceiling of the vehicle 100. For example, the image acquisition module may be attached to the ceiling in the interior of the vehicle 100 with a predetermined connection member disposed between the image acquisition module and the ceiling. Since the image acquisition module is disposed at the ceiling in the interior of the vehicle 100, there is an advantage in acquiring an image of the outside of the vehicle 100 at the highest position in the vehicle. That is, a wider field of view may be achieved.

The processor 970 may be electrically connected to the image sensor 814. The processor 970 may computer-process an image acquired by the image sensor 814. The processor 970 may control the image sensor 814.

The processor 970 may be implemented in a hardware manner using at least one selected from among Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, and electric units for the implementation of other functions.

The processor 970 may be mounted on the processing board 820.

The processing board 820 may have the processor 270 and a memory 940 mounted thereon.

The processing board 820 may be inclined in the overall-length direction. For example, the processing board 820 may be disposed such that a front surface or a rear surface faces the front windshield (WS). For example, the processing board 820 may be disposed in parallel with the front windshield (WS).

The front windshield (WS) provided in the vehicle 100 is generally inclined from a bonnet to a roof of the vehicle with a predetermined angle relative to the ground. In this case, since the processing board 820 is disposed to be inclined in the overall length direction, the camera 310a may be formed small in size compared to the case where the processing board 820 is disposed vertically or horizontally. A space in the vehicle 100 may be secured as much as the reduced volume of the camera 310a.

A plurality of elements or electronic components may be mounted on the processing board 820. In this case, heat may be generated by the plurality of elements or components included in the processing board 820.

The processing board 820 may be spaced apart from the image sensor 814. Since the processing board 820 is spaced apart from the image sensor 814, it is possible to prevent heat generated in the processing board 820 from affecting performance of the image sensor 814.

The processing board 820 may be disposed at a position optimal to prevent the heat generated in the processing board 820 from affecting the image sensor 814. Specifically, the processing board 820 may be disposed below the image sensor 814. Alternatively, the processing board 820 may be disposed in front of the image sensor 814.

One or more memories 940 may be mounted on the processing board 820. A memory 940 may store an image acquired by the image sensor 814, a variety of application data, data necessary to control the processor 970, or data to be processed by the processor 970. The memory 940 is one of main heat generating causes including the processor 970. While the processor 970 is disposed at the center of the processing board 820, the memory 940 may be disposed in the vicinity of the processor 970. For example, one or more memories 940 may be disposed to surround the processor 970 positioned at the center. In this case, the processor 970 and the memory 940, which are heat generating elements, may be disposed at the most distal positions from the image sensor 814.

The processor 970 may be electrically connected to the controller 170. The processor 970 may be controlled by the controller 170.

The light shield 830 may be disposed in front of the lens unit 811. The light shield 830 may prevent that light unnecessary to acquire images is introduced into the lens unit 811. For example, the light shield 830 may prevent light reflected from the windshield (WS), a dashboard of the vehicle, etc. In addition, the light shield 830 may prevent light generated from an unnecessary light source.

The light shield 830 may have a partition shape. For example, the light shield 830 may have a lower partition shape.

Meanwhile, the shape of the light shield 830 may vary depending on a type of the vehicle. For example, a curvature of the windshield and an angle of the windshield relative to the ground may vary depending on a type of the vehicle, and thus, the light shield 830 may have a shape corresponding to a type of the vehicle to which the camera 310a is mounted. To this end, the light shield 830 may have a detachable structure.

The dissipation member 840 may be disposed behind the image sensor 814. The dissipation member 840 may come into contact with the image sensor 814 or an image sensor board on which the image sensor 814 is mounted. The dissipation member 840 may process heat generated by the image sensor 814.

As described above, the image sensor 814 is sensitive to heat. The dissipation member 840 may be interposed between the image sensor 814 and the third housing 853. The dissipation member 840 may be disposed to be brought into contact with the image sensor 814 and the third housing 853. In this case, the dissipation member 840 may dissipate heat through the third housing 853.

For example, the dissipation member 840 may be one of a thermal pad and a thermal grease.

The housing 250 may form an external appearance of the camera apparatus 310. The housing 250 houses each element of the camera apparatus 310. The housing 250 may house the lens 811, the image sensor 814, and the processing board 820.

The housing 250 may include a lens housing 817, a first housing 851, a second housing 852, and a third housing 853.

The lens housing 817 may house at least one lens unit 811, and project the lens unit 811 from external impact.

The first housing 851 may be formed to embrace the image sensor 814. The first housing 851 may include a hole 819. Arranged in the hole 819 within the lens housing 817, the lens unit 811 may be connected to the image sensor 814.

The first housing 851 may be configured to have a thickness that gradually increases toward the image sensor 814. For example, the first housing 851 may be formed in die casting process. In this case, in order to prevent performance deterioration of the image sensor 814 caused by heat, the first housing 851 may have a greater thickness at portions close to the image sensor 814.

The first housing 851 may have a thickness greater than that of the third housing 853. As a thickness of the housing increases, a heat transfer rate is lowered. Accordingly, if the first housing 851 has a thickness greater than that of the third housing 853, heat generated in the camera 310a may be dissipated to the outside through the third housing 853 rather than the first housing 851, which is disposed so close to the front windshield (WS) and thus difficult to dissipate heat.

Meanwhile, in some embodiments, the lens housing 817 and the first housing 851 may be integrally formed with each other.

The second housing 852 may be disposed in front of the processing board 820. The second housing 852 may be fastened to the first housing 851 and the third housing 853 by a predetermined fastening means.

The second housing 852 may have an attachment means to which the light shield 830 is allowed to be attached. The light shield 830 may be attached to the second housing 852 through the attachment means.

The first and second housings 852 and 853 may be formed of a synthetic resin material.

The third housing 853 may be fastened to the first housing 851 and the second housing 852 by a predetermined fastening means. In some embodiments, the first, second, and third housings 851, 852, and 853 may be integrally formed with each other.

The third housing 853 may be formed to embrace the processing board 820. The third housing 853 may be disposed behind or below the processing board 820. The third housing 853 may be formed of a thermally conductive material. For example, the third housing 853 may be formed of metal such as aluminum. Being formed of a thermally conductive material, the third housing 853 may efficiently dissipate heat.

In the case where the first and second housings 851 and 852 are formed of synthetic resin material and the third housing 853 is formed of a thermally conductive material, heat generated in the camera 310a may be dissipated through the third housing 853 rather than the first and second housings 851 and 852. That is, when the camera 310a is mounted to a windshield, the first and second housings 851 and 852 are positioned near the windshield, and thus, heat cannot be dissipated through the first and second housings 851 and 852. In this case, the heat may be efficiently dissipated through the third housing 853.

Meanwhile, in the case where the third housing 853 is formed of aluminum, it may be advantageous to project inner components (e.g., the image sensor 814 and the processor 970) from electro-magnetic compatibility (EMC) and electrostatic discharge (ESC).

The third housing 853 may be brought into contact with the processing board 820. In this case, the third housing 853 may dissipate heat to the outside through a portion in contact with the processing board 820.

The third housing 853 may further include a radiating unit 891. For example, the radiating unit 891 may include at least one of a heat sink, radiating fins, a thermal pad, or thermal grease.

The radiating unit 891 may dissipate heat, generated in the camera 310a, to the outside. For example, the radiating unit 891 may be disposed between the processing board 820 and the third housing 853. As being in contact with the processing board 820 and the third housing 853, the radiating unit 891 may dissipate heat generated in the processing board 820.

The third housing 853 may further include an air discharge hole. The air discharge hole is a hole for discharging air of high temperature in the camera 310a to the outside of the camera 310a. The camera 310a may include an air flow unit connected to the air discharge hole. The air flow unit may guide air of high temperature in the camera 310a toward the air discharge hole.

The camera 310a may further include a moisture proof unit. The moisture proof unit may be in a patch shape and attached to the air discharge hole. The moisture prove unit may be a moisture proof member made of Gore-Tex. The moisture proof unit may allow moisture in the camera 310a to be discharged to the outside. In addition, the moisture proof unit may prevent the camera 310a from external moisture.

Figure 9A:
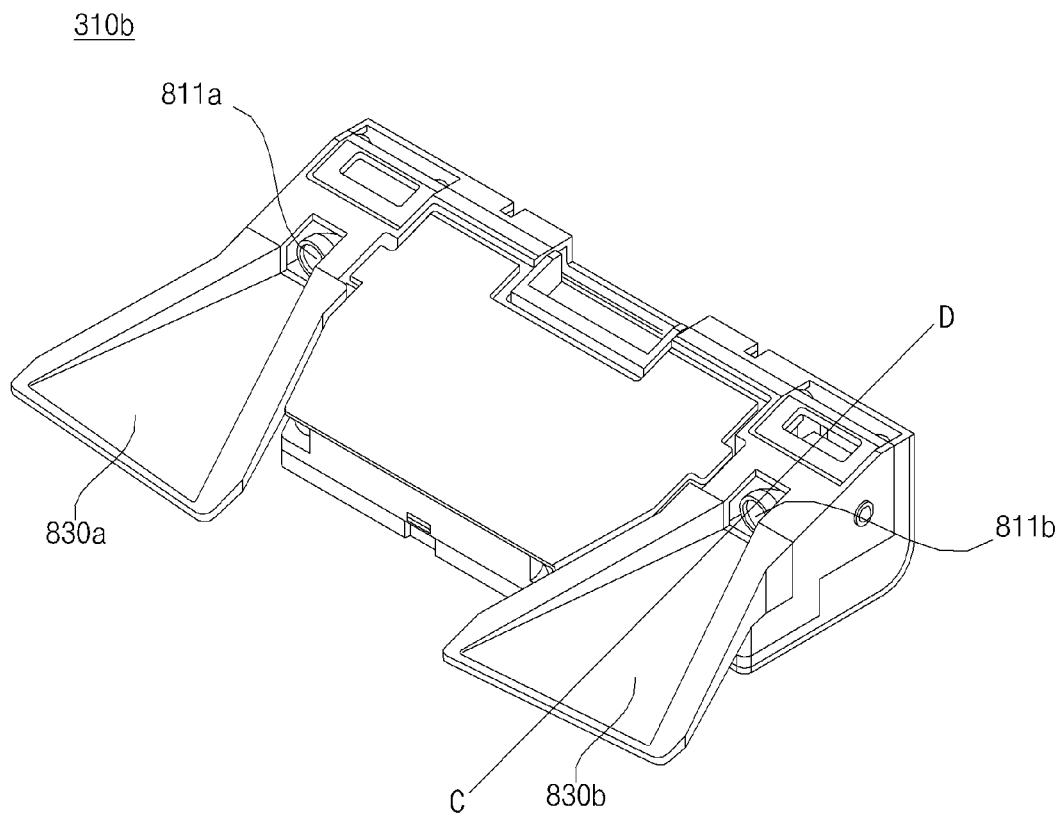
FIG. 9A is a perspective view of a camera for a vehicle according to an embodiment of the present invention.
Figure 9B:
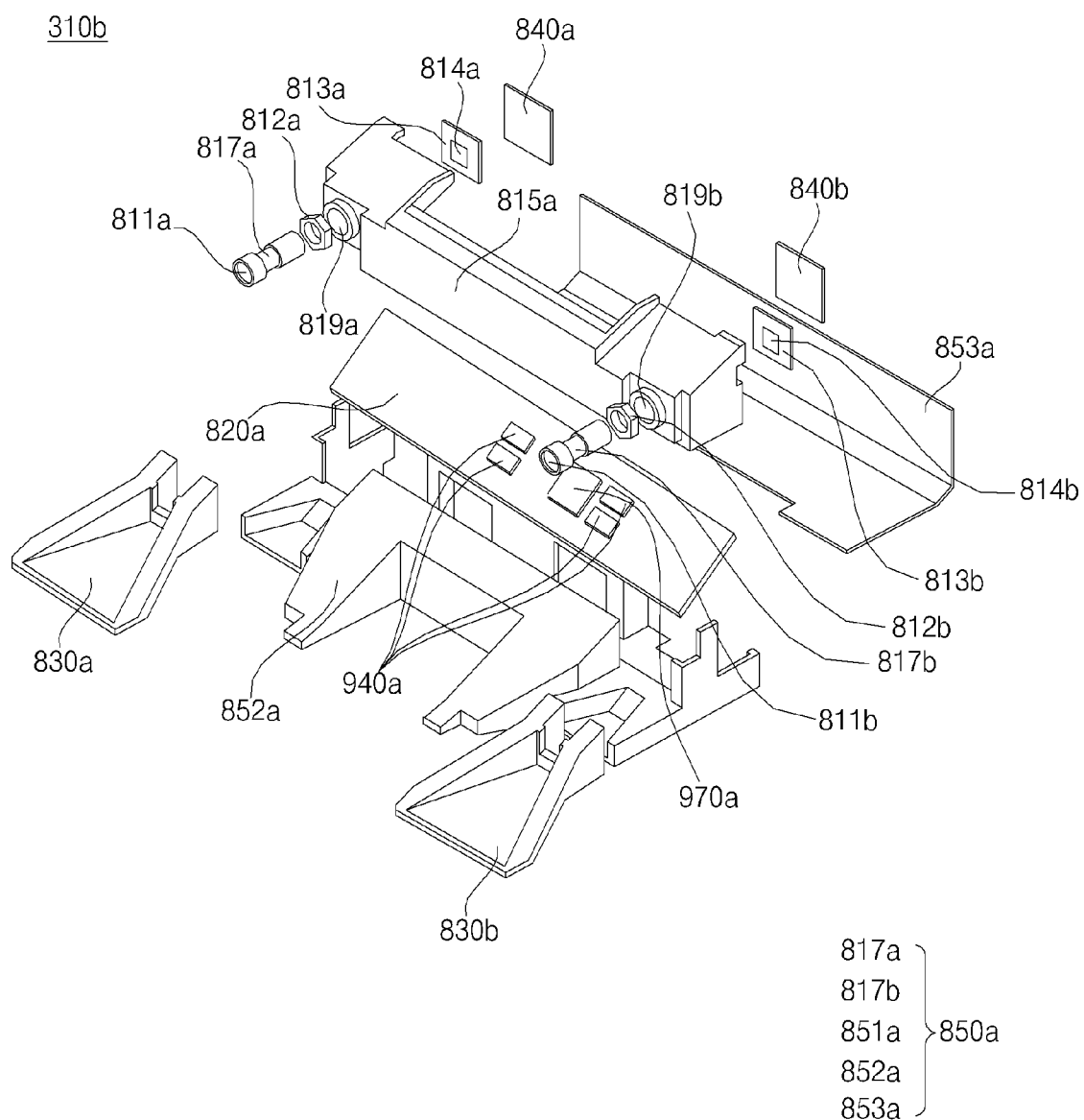
FIG. 9B is an exploded perspective view of a camera for a vehicle according to an embodiment of the present invention.
Figure 9C:
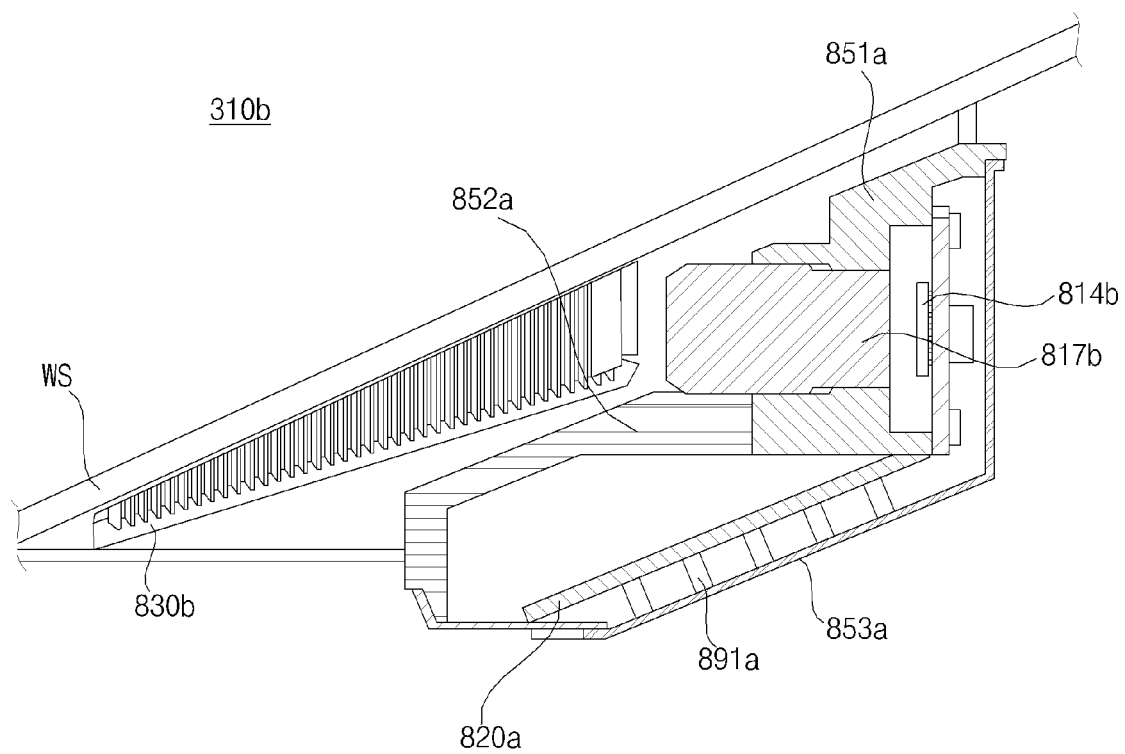
FIG. 9C is a sectional side view of a camera for a vehicle, which is taken along line C-D of FIG. 9A.

FIG. 9A is a perspective view of a camera for a vehicle according to an embodiment of the present invention. FIG. 9B is an exploded perspective view of a camera for a vehicle according to an embodiment of the present invention. FIG. 9C is a sectional side view of a camera for a vehicle, which is taken along line C-D of FIG. 9A.

The camera 310 which will be described with reference to FIGS. 9A and 9B is a stereo camera 310b.

The description about the single camera 310a in FIGS. 8A to 8C may apply to the stereo camera 310b. That is, first and second cameras included in the stereo camera 310b may be the camera described above with reference to FIGS. 8A to 8C.

The stereo camera 310b may include a first lens unit 811a, a second lens unit 811b, a first image sensor 814a, a second image sensor 814b, and a processor 870a.

In some embodiments, the camera 310b may further include a processing board 820a, a first light shield 830a, a second light shield 830b, and a housing 250a individually or in combination.

Meanwhile, the housing 250a may further include a first lens housing 817a, a second lens housing 817b, a first housing 851a, a second housing 852a, and a third housing 853a.

The description about the lens unit 811 in FIGS. 8A to 8C may apply to the first lens unit 811a and the second lens unit 811b.

The description about the image sensor 814 in FIGS. 8A to 8C may apply to the first image sensor 814a and the second image sensor 814b.

Meanwhile, a module including the first lens unit 811a and the first image sensor 814a may be referred to as a first image acquisition module. In addition, a module including the second lens unit 811b and the second image sensor 814b may be referred to as a second image acquisition module.

The processor 970a may be electrically connected to the first image sensor 814a and the second image sensor 814b. The processor 970a may process images acquired through the first image sensor 814a and the second image sensor 814b. In this case, the processor 970a may form a disparity map or calculate a disparity based on the images acquired through the first image sensor 814a and the second image sensor 814b.

The processor 970a may be implemented in a hardware manner using at least one selected from among Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, and electric units for the implementation of other functions.

The processor 970a may be mounted on the processing board 820a.

The description about the processing board 820 in FIGS. 8A to 8C may apply to the processing board 820a.

The description about the light shield 830 in FIGS. 8A to 8C may apply to the first light shield 830a and the second light shield 830b.

The description about the lens housing 817 in FIGS. 8A to 8C may apply to the first lens housing 817a and the second lens housing 817b.

The description about the first housing 851 in FIGS. 8A to 8C may apply to the first housing 851a.

The description about the second housing 852 in FIGS. 8A to 8C may apply to the second housing 852a.

The description about the third housing 853 in FIGS. 8A to 8C may apply to the third housing 853a.

Figure 10:
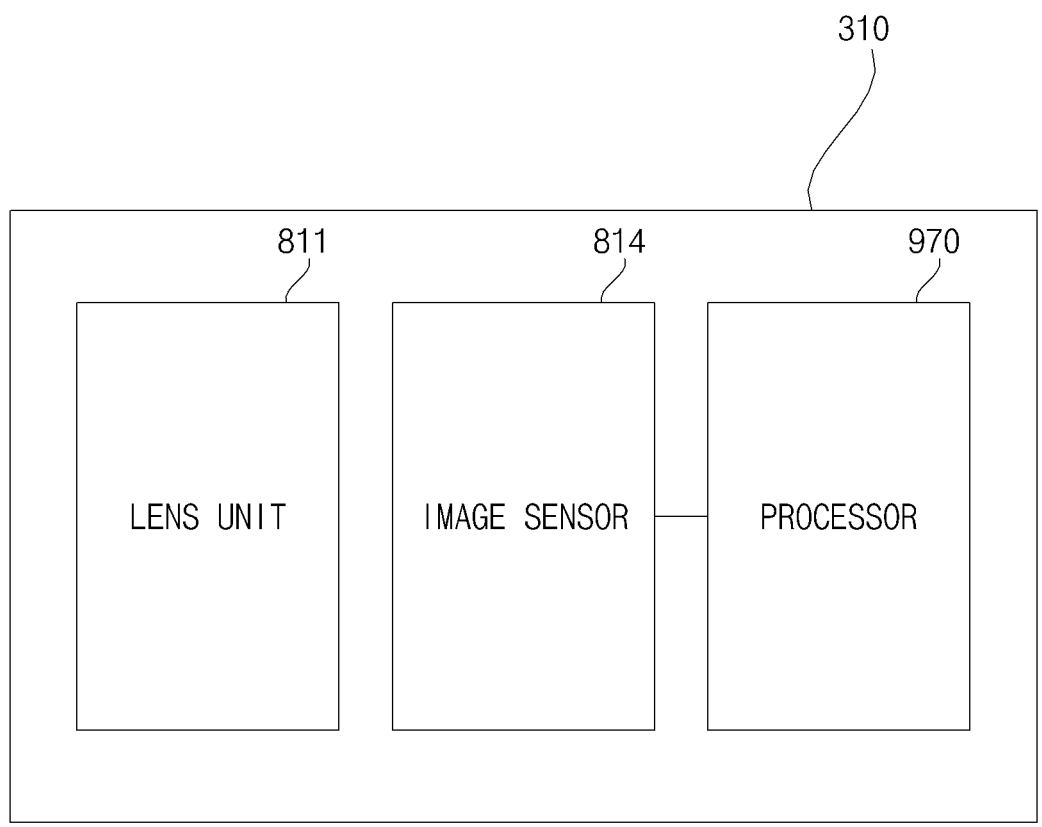
FIG. 10 is a conceptual diagram showing major elements of a camera apparatus for a vehicle according to an embodiment of the present invention.

FIG. 10 is a conceptual diagram showing major elements of a camera apparatus for a vehicle according to an embodiment of the present invention.

Referring to FIG. 10, a camera apparatus 310 may include a lens unit 811, an image sensor 814, and a processor 970.

The lens unit 811 may change an optical path along which light is introduced from the outside. The lens unit 811 may guide the light to form an image in a predetermined plane.

The lens part 811 may cause a plurality of image acquisition regions differentiated in a horizontal direction to have different focal lengths.

The image acquisition regions may refer to a space between an object and the lens unit 811 and a space between the lens unit 811 and the image sensor 814.

The image acquisition regions will be described in more detail with reference to FIG. 11B.

The plurality of image acquisition regions may include a central region and a peripheral region.

The central region may be a region for acquiring an image of an object located at a relatively far distance from a vehicle 100. For example, the central region may be a region for acquiring an image of an object located in a space 80m or more from the vehicle 100. The central region may be a far field region.

The peripheral region may be a region for acquiring an image of an object located at a relatively near distance from the vehicle 100. For example, the peripheral region may be a region for acquiring an image of an object located in a space 80m or less from the vehicle 100. The peripheral region may be a near field region.

A focal length of the lens 811 in the central region may be longer than a focal length of the lens 11 in the peripheral region. A focal length of a lens necessary to acquire an image of an object located at a far distance should be longer than a focal length of a lens necessary to acquire an image of an object located at a near distance.

In the central region, an image may be formed on a first plane. Here, the first plane may be a virtual plane on which an image is formed in the central region by light having passed through the lens unit 811.

In the peripheral region, an image may be formed on a second plane. Here, the second plane may be a virtual plane on which an image is formed in the peripheral region by light having passed through the lens unit 811. The second plane may have a position different from that of the first plane.

A field of view (FOV) of the lens unit 811 in the central region may be narrower than an FOV of the lens unit 811 in the peripheral region. An FOV of a lens necessary to acquire an image of an object located at a far distance should be narrower than an FOV of a lens necessary to acquire an image of an object located at a near distance.

The image sensor 814 may include at least one photoelectric transformation element, such as a charge-coupled device (CCD) or a complimentary metal-oxide semiconductor (CMOS), which is capable of transforming an optical signal into an electrical signal.

The image sensor 814 may include a plurality of pixels. For example, each of the plurality of pixels may include a photo diode and a transistor.

The image sensor may include a plurality of pixel arrays formed to correspond to the plurality of image acquisition regions.

The image sensor 814 may include a central pixel array and a peripheral pixel array.

The pixel array may be defined as a plurality of pixels disposed on a plane.

The central pixel array may correspond to the central region in the plurality of image acquisition regions.

The peripheral pixel array may correspond to the peripheral region in the plurality of image acquisition regions.

The image sensor 814 may convert light incident on the plurality of pixel arrays through the lens unit 811 into an electrical signal.

The central pixel array may convert light entering from the central region into an electrical signal.

The peripheral pixel array may convert light entering from the peripheral region into an electrical signal.

In some embodiments, the image sensor 814 may be provided in plural.

For example, the image sensor 814 may include a first image sensor and a second image sensor.

The processor 970 may be electrically connected to the image sensor 814. The processor 970 may generate an image based on the electrical signal received from the image sensor 814. The processor 970 may process the image.

The processor 970 may generate an image based on an electrical signal.

Figure 11A:
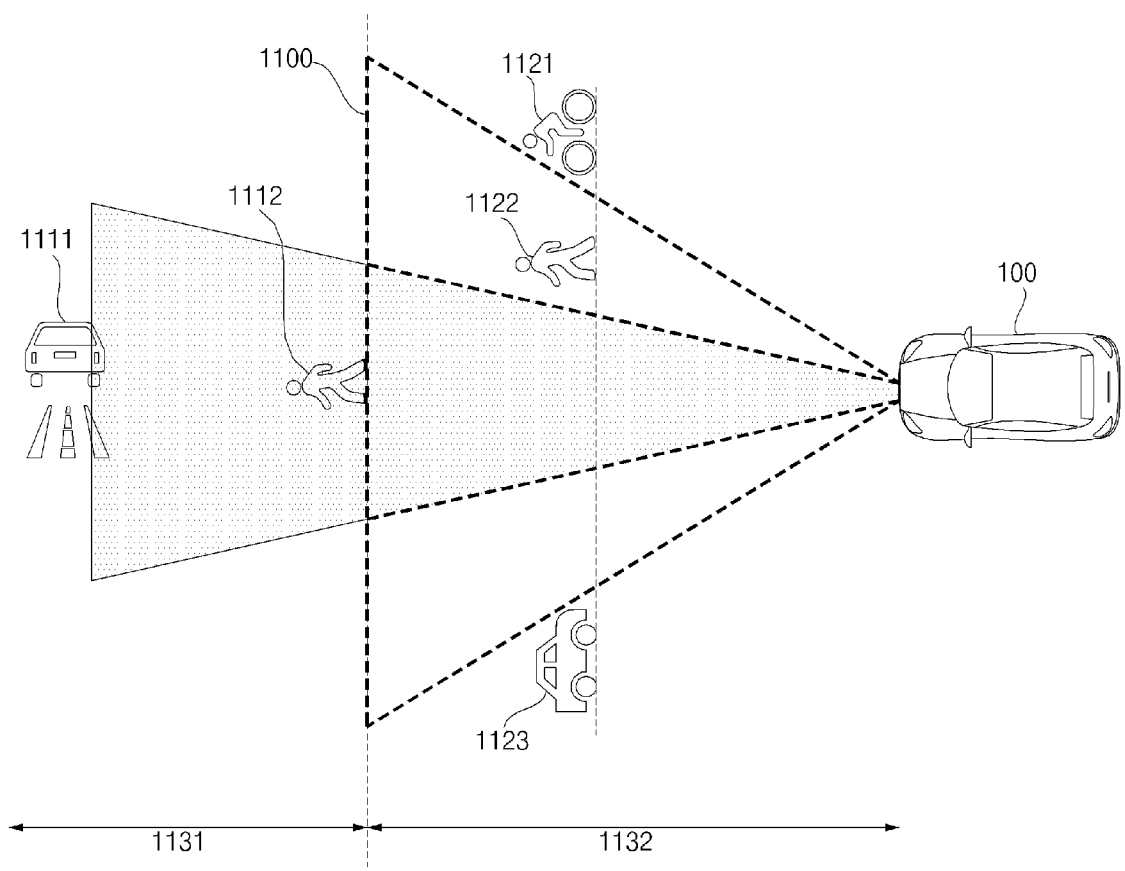
FIG. 11A is a conceptual diagram for describing a far field and a near field according to an embodiment of the present invention.

FIG. 11A is a conceptual diagram for describing a far field and a near field according to an embodiment of the present invention.

Referring to FIG. 11A, a space at and beyond a reference distance 1100 from a vehicle 100 in a forward direction of the vehicle 100 may be defined as a far field 1131.

For example, the far field 1131 may refer to a space far from the vehicle 100 by 80*m* or more in the forward direction of the vehicle 100.

A space within a distance less than the reference distance 1100 from the vehicle 100 may be defined as a near field 1132.

For example, the near field 1132 may refer to a space from the vehicle 100 by a distance less than 80*m* in the forward direction of the vehicle 100.

A camera apparatus 310 for a vehicle may acquire an image of an object 1111 or 1112 positioned in the far field, and an image of an object 1121 or 1122 positioned in the near field.

Figure 11B:
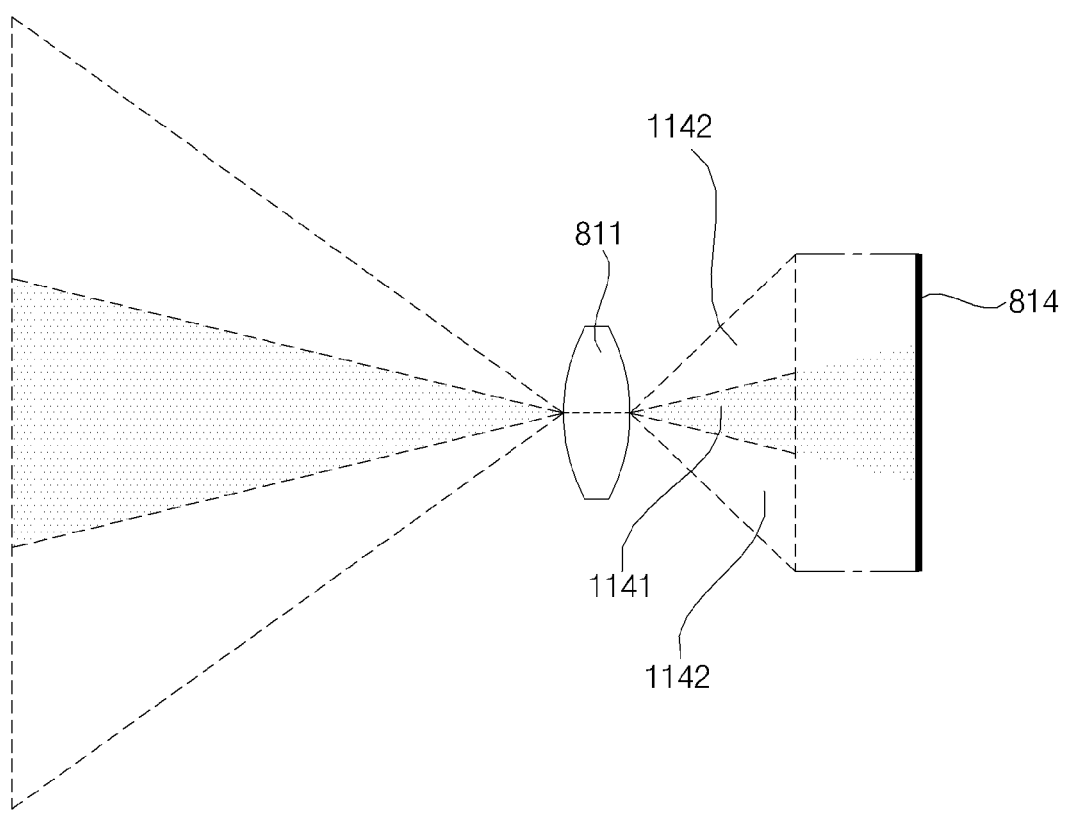
FIG. 11B is a diagram for explanation of an image acquisition region according to an embodiment of the present invention.

FIG. 11B is a diagram for explanation of an image acquisition region according to an embodiment of the present invention.

Referring to FIG. 11B, a plurality of image acquisition regions may include a central region 1141 and a peripheral region 1142.

The central region 1141 may be an image acquisition region in a far field. The central region 1141 may be a region for acquiring an image in the far field within a space formed between a lens unit 811 and an image sensor 814.

The peripheral region 1142 may be an image acquisition region in a near field. The peripheral region 1142 may be a region for acquiring an image in the near field within the space formed between the lens unit 811 and the image sensor 814.

A focal length of the lens unit 811 in the central region 1141 may be longer than a focal length of the lens unit 811 in the peripheral region 1142.

The lens unit 811 in the central region 1141 is formed suitable to detect an object located in the far field. The lens unit 811 in the peripheral region 1142 is formed suitable to detect an object located in the near field. Therefore, a focal length of the lens 811 in the central region 1141 should be longer than a focal length of the lens unit 811 in the peripheral region 1142.

An FOV of the lens 811 in the central region 1141 may be narrower than an FOV of the lens 811 in the peripheral region 1142.

The lens unit 811 in the central region 1141 is formed suitable to detect an object located in the far field. The lens unit 811 in the peripheral region 1142 is formed suitable to detect an object located in the near field. Therefore, an FOV of the lens 811 in the central region 1141 should be narrower than an FOV of the lens unit 811 in the peripheral region 1142.

Figure 12:
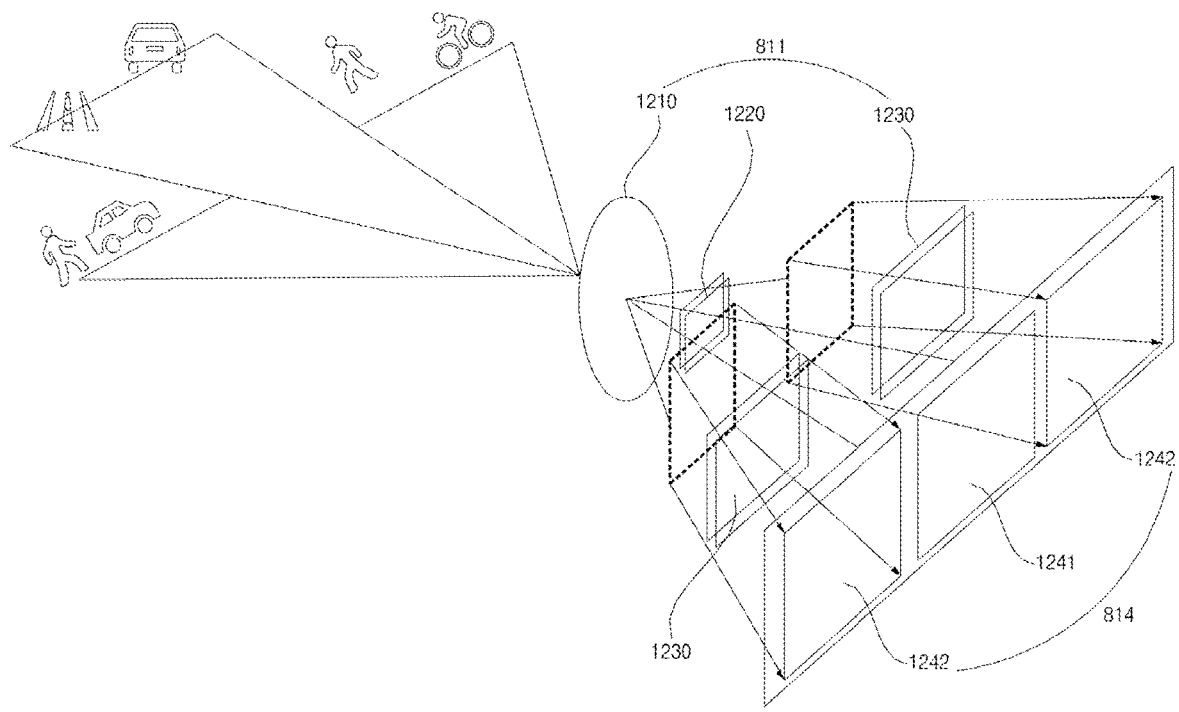
FIG. 12 is a conceptual diagram for explanation of configuration of a camera apparatus for a vehicle according to an embodiment of the present invention.

FIG. 12 is a conceptual diagram for explanation of configuration of a camera apparatus for a vehicle according to an embodiment of the present invention.

Referring to FIG. 12, a lens unit 811 may include a reference lens 1210, a zonal lens 1220, and a field lens 1230.

The reference lens 1210 may allow light to pass through a plurality of image acquisition regions.

The reference lens 1210 may have a fixed focal distance.

For example, the reference lens 1210 may be a short focal lens that has a short focal length.

For example, the reference lens 1210 may be a long focal lens that has a long focal length.

The reference lens 1210 may have a uniform focal length over the plurality of image acquisition regions.

The zonal lens 1220 may be interposed between the reference lens 1210 and the image sensor 814.

The zonal lens 1220 may cause the plurality of image acquisition regions to be differentiated. The plurality of image acquisition regions may be differentiated by whether light having passed through the reference lens 1210 passes through the zonal lens 1220.

For example, a region in which light having passed through the reference lens 1210 passes through the zonal lens 1220 among the plurality of image acquisition regions may be a central region 1141. In this case, a region in which the light having passed through the reference lens 1210 does not pass through the zonal lens 1220 among the plurality of image acquisition regions may be a peripheral region 1142 (see the embodiment of FIG. 13).

For example, a region in which light having passed the reference lens 1210 does not pass through the zonal lens 1220 among the plurality of image acquisition regions may be the central region 1141. In this case, a region in which the light having passed through the reference lens 1210 passes through the zonal lens 1220 among the plurality of image acquisition images may be the peripheral region 1142 (see the example of FIG. 14).

A focal length in each of the plurality of image acquisition regions may vary according to whether the light having passed through the reference lens 1210 passes through the zonal lens 1220 in a corresponding image acquisition region.

For example, in the case where the reference lens 1210 is a lens having a short focal length, the focal length may increase in a region in which light having passed the reference lens 1210 passes through the zonal lens 1220.

For example, in the case where the reference lens 1210 is a lens having a long focal length, the focal length may be decrease in a region in which light having passed the reference lens 1210 passes through the zonal lens 1220.

The field lens 1230 may transfer an image formed in a plane different from a plane of the image sensor 814 to the plane of the image sensor 814.

The image sensor 814 may be disposed based on a focal length of the lens unit 811 in the central region 1141. The image sensor 814 may be disposed on a plane on which an image is formed is the central region 1141.

In this case, a position of the image sensor 814 may not match a focal distance of the lens unit 811 in the peripheral region 1142. The image sensor 814 may not be disposed on a plane on which an image is formed in the peripheral region 1142.

In this case, the field lens 1230 may transfer the image formed in the peripheral region 1142 to the plane on which the image sensor 814 is disposed.

FIGS. 13 to 16 are diagrams for explanation of a specific example of a camera apparatus for a vehicle according to an embodiment of the present invention.

FIGS. 13 to 16 are top views of part of a camera apparatus for a vehicle.

Figure 13:
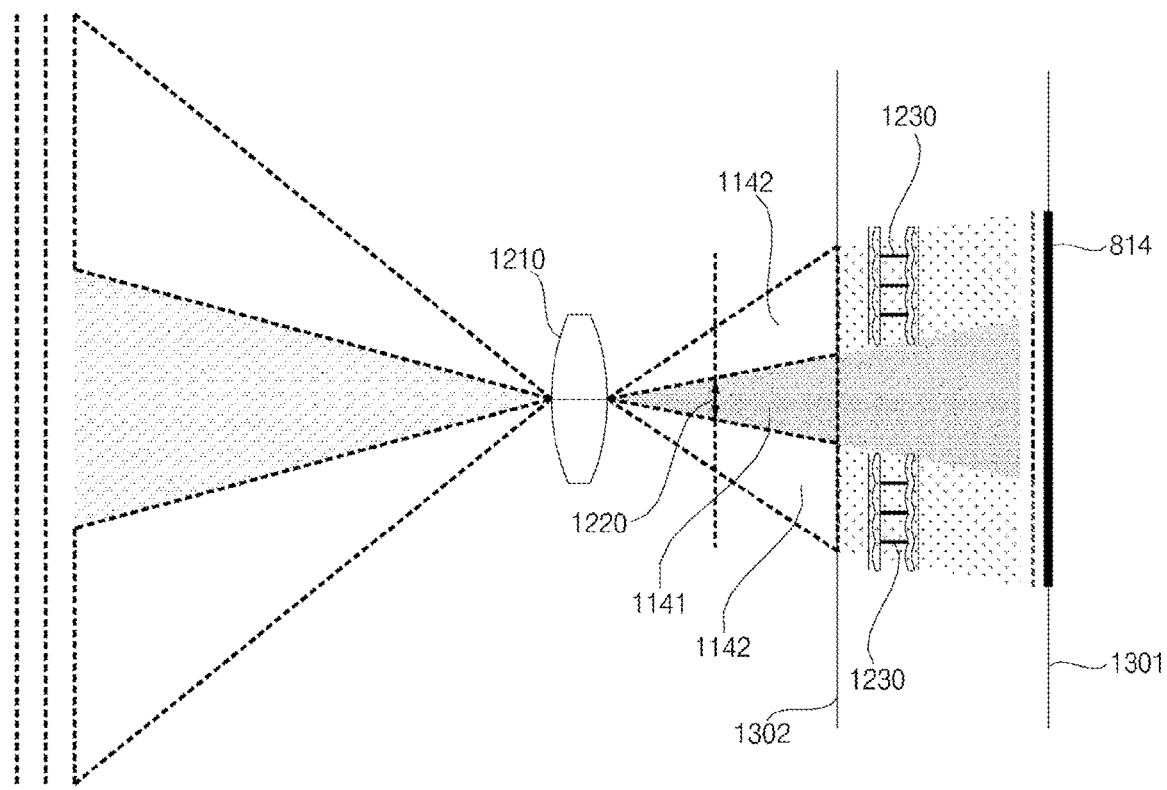
FIGS. 13 to 16 are diagrams for explanation of a specific example of a camera apparatus for a vehicle according to an embodiment of the present invention.

Referring to FIG. 13, a plurality of image acquisition regions may include a central region 1141 and a peripheral region 1142.

The central region 1141 may be a region in which light having passed a reference lens 1210 passes through a zonal lens 1220.

The peripheral region 1142 may be a region in which the light having passed the reference lens 1210 does not pass through the zonal lens 1220.

The reference lens 1210 may be a lens having a first focal length. The reference lens 1210 may be a short focal lens.

The zonal lens 1220 may be interposed between the reference lens 1210 and the image sensor 814.

The zonal lens 1220 may be disposed to match the central portion of the reference lens 1210.

In some embodiments, the reference lens 1210 and the zonal lens 1220 may be integrally formed with each other.

The zonal lens 1220 may cause a focal length of the lens unit 811 in the central region 1141 to be longer than a focal length of the lens unit 811 in the peripheral region 1142.

The image sensor 814 may be disposed on a first plane 1301 on which an image is formed in the central region 1141. Here, the first plane may be a virtual plane on which an image is formed in the central region 1141 by light having passed through the lens unit 811.

The lens unit 811 may further include a field lens 1230. The field lens 1230 may transfer an image of the peripheral region 1142, which is formed on a second plane 1302 different from the first plane 1301, to the image sensor 814. The second plane may be a virtual plane on which an image is formed in the peripheral region 1142 by light having passed through the lens unit 811. The second plane may have a different position from a position of the second plane.

Since a focal length in the central region 1141 and a focal length in the peripheral region 1142 are different, images may be formed on different planes. In this case, the field lens 1230 may transfer an image formed on the plane 1302 different from the plane 1301 of the image sensor 814 to the plane 1301 of the image sensor 814.

Figure 14:
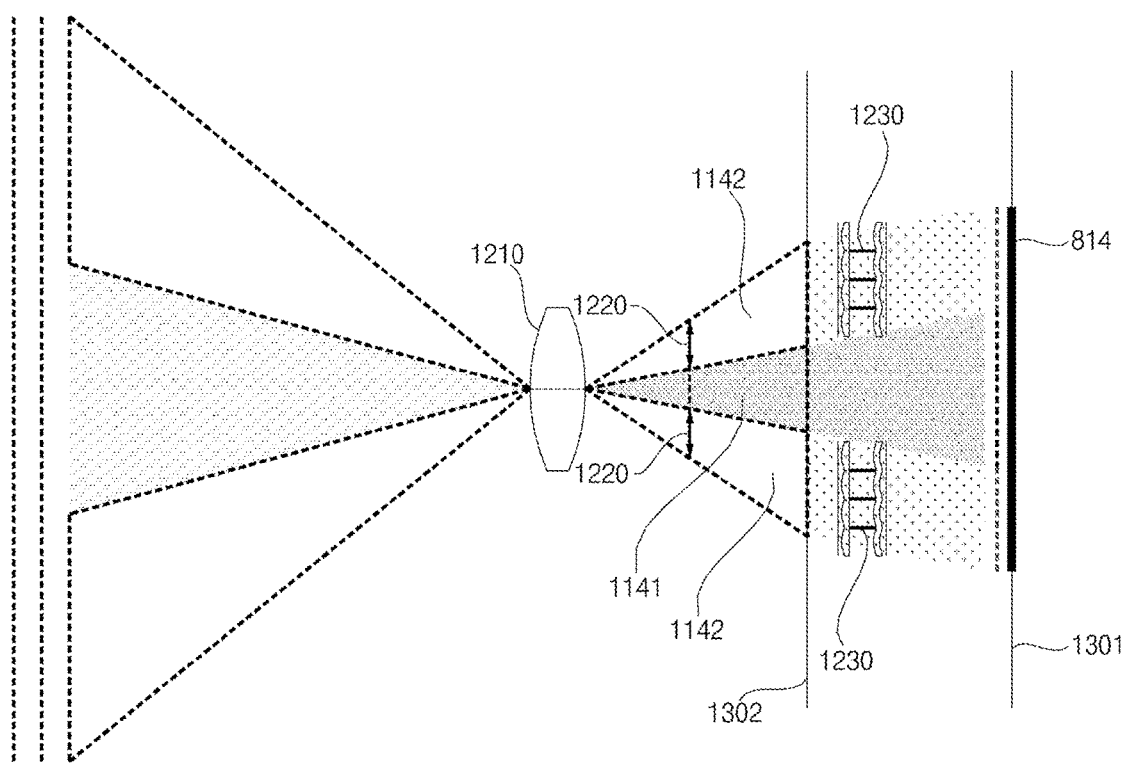

Referring to FIG. 14, a plurality of image acquisition regions may include a central region 1141 and a peripheral region 1142.

The central region 1141 may be a region in which light having passed through a reference lens 1210 does not pass through a zonal lens 1220.

The peripheral region 1142 may be a region in which the light having passed through the reference lens 1210 passes through the zonal lens 1220.

The reference lens 1210 may be a lens having a second focal length. The reference lens 1210 may be a long focal lens.

The zonal lens 1220 may be interposed between the reference lens 1210 and an image sensor 814.

The zonal lens 1220 may be disposed to match the peripheral portion of the reference lens 1210.

In some embodiments, the reference lens 1210 and the zonal lens 1220 may be integrally formed with each other.

The zonal lens 1220 may cause a focal length of a lens unit 811 in the peripheral region 1142 to be shorter than a focal length of the lens unit 811 in the central region 1141.

The image sensor 814 may be disposed on a first plane 1301 on which an image is formed in the central region 1141. Here, the first plane may be a virtual plane on which an image is formed in the central region 1141 by light having passed through the lens unit 811.

The lens unit 811 may further include a field lens 1230. The field lens 1230 may transfer an image of the peripheral region 1142 formed on a second plane 1302 having a position different from a position of the first plane 1301 to the image sensor 814. The second plane 1302 may be a virtual plane on which an image is formed in the peripheral region 1142 by light having passed the lens unit 811. The second plane 1302 may have a position different from a position of the first plane 1301.

Since a focal length in the central region 1141 and a focal length in the peripheral region 1142 are different, images may be formed on different planes. In this case, the field lens 1230 may transfer an image formed on the plane 1302 different from the plane of the image sensor 814 to the plane 1301 of the image sensor 814.

Figure 15:
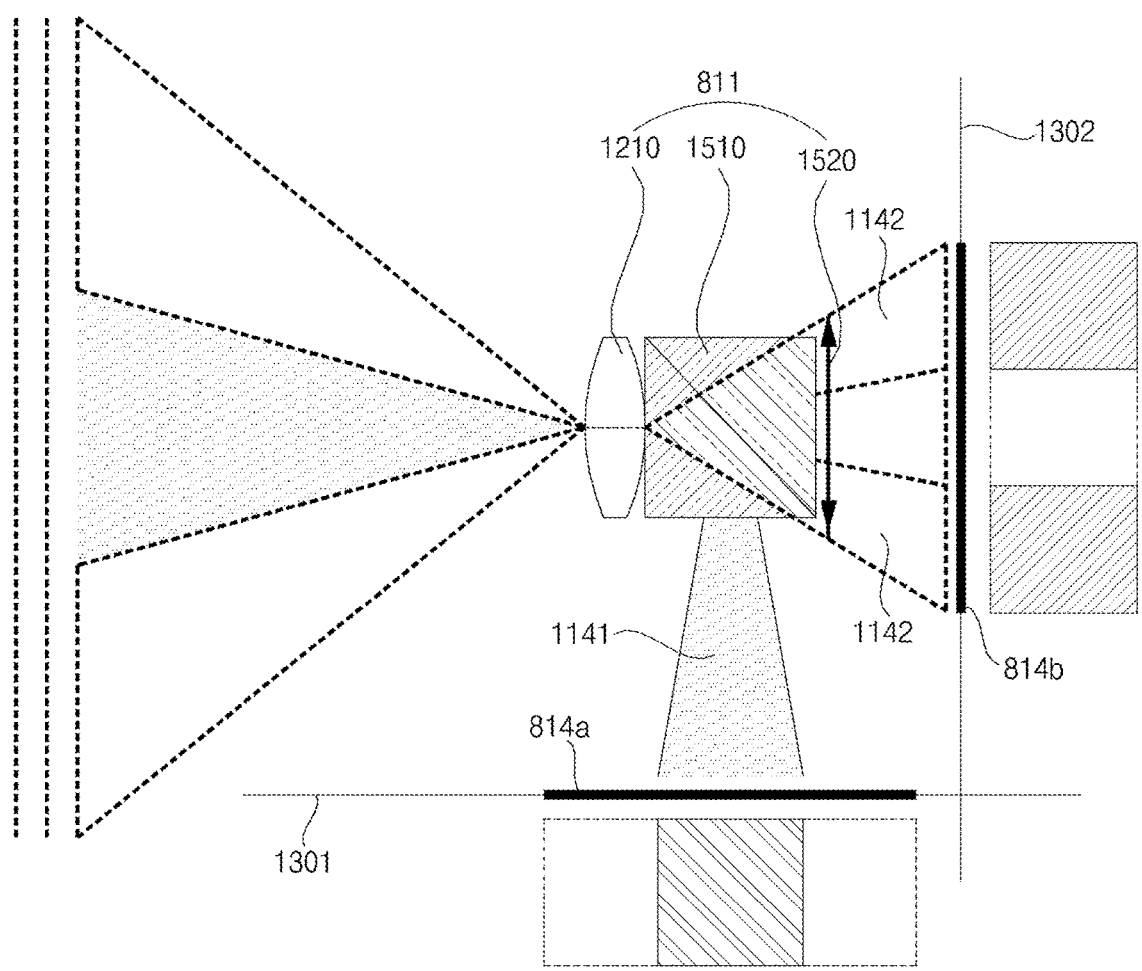

Referring to FIG. 15, a lens unit 811 may include a reference lens 1210 and a beam splitter 1510.

The reference lens 1210 may be a lens having a first focal length. The reference lens 1210 may be a short focal lens.

The reference lens 1210 may be a lens having a second focal length. The reference lens 1210 may be a long focal lens.

The beam splitter 1510 may be interposed between the reference lens 1210 and an image sensor 814.

The beam splitter 1510 may split incident light into first light having a first optical path and second light having a second optical path.

The beam splitter 1510 may include a prism.

A plurality of image acquisition regions may include a central region 1141 and a peripheral region 1142.

The central region 1141 may be a region in which an image is acquired by the first light.

The peripheral region 1142 may be a region in which an image is acquired by the second light.

Meanwhile, the image sensor 814 may include a first image sensor 814a and a second image sensor 814b.

The first image sensor 814a may include a central pixel array. The first image sensor 814a may convert the first light into an electrical signal.

The first image sensor 814a may be disposed on a first plane 1301 on which an image is formed in the central region 1141.

The second image sensor 814b may include a peripheral pixel array. The second image sensor 814b may convert the second light into an electrical signal.

The second image sensor 814b may be disposed on the second plane 1302 on which an image is formed in the peripheral region 1142. The second plane 1302 may have a position different from a position of the first plane 1301.

The lens unit 811 may further include an additional lens 1502.

The additional lens 1502 may be interposed between the beam splitter 1510 and the first image sensor 814a.

In this case, the additional lens 1520 may adjust a focal length of the lens unit 811 in the central region 1141.

If the reference lens 1210 is a lens having a first focal length, the additional lens 1520 may cause a focal length of the lens unit 811 in the central region 1141 to be longer than a focal length of the lens unit 811 in the peripheral region 1142.

The additional lens 1520 may be interposed between the beam splitter 1510 and the second image sensor 814b.

In this case, the additional lens 1520 may adjust the focal length of the lens unit 811 in the peripheral region 1142.

If the reference lens 1210 is a lens having a second focal length, the additional lens 1520 may cause the focal length of the lens unit 811 in the peripheral region 1142 to be shorter than the focal length of the lens unit 811 in the central region 1141.

As such, the additional lens 1520 is provided, thereby adjusting a position at which the image sensor 814 is disposed.

The lens unit 811 may further include a field lens.

The field lens may be interposed between the beam splitter 1510 and the first image sensor 814*a*.

The field lens may transfer an image formed on a plane different from a plane on which the first image sensor 814 is disposed in the central region to the plane on which the first image sensor 814*a* is disposed.

The field lens may be interposed between the beam splitter 1510 and the second image sensor 814*b*.

The field lens may transfer an image formed on a plane different from the plane on which the second image sensor 814*b* is disposed in the peripheral region to the plane on which the second image sensor 814*b* is disposed.

In some embodiments, the processor 970 may crop a portion corresponding to the central region 1141 from an image acquired through the first image sensor 814*a* to thereby acquire the portion.

The processor 970 may crop a portion corresponding to the peripheral region 1142 from an image acquired through the second image sensor 814*b* to thereby acquire the portion.

Figure 16:
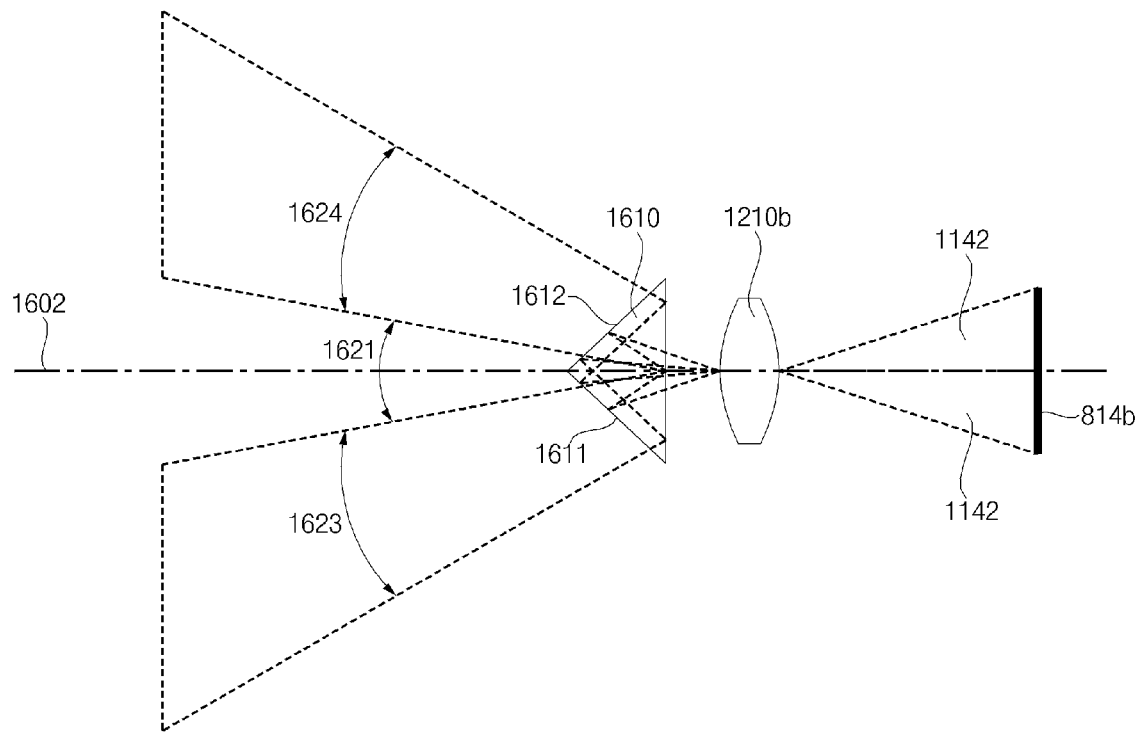
Figure 16:
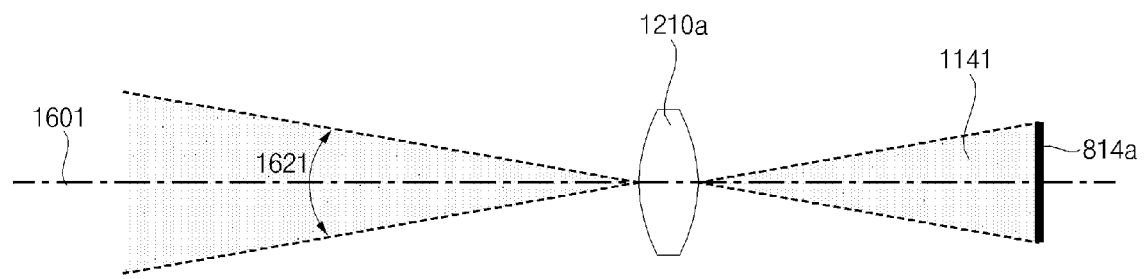

Referring to FIG. 16, a lens unit 811 may include a first reference lens 1210*a*, a second reference lens 1210*b*, and a roof prism 1610.

The first reference lens 1210*a* may be a lens having a first local length. The first reference lens 1210*a* may be a long focal lens.

The first reference lens 1210*a* may be disposed on a first optical path 1601.

The second reference lens 1210*b* may be a lens having a second focal length. The second reference lens 1210*b* may be a short focal lens.

The second reference lens 1210*b* may be disposed on a second optical path 1602. The second optical path 1602 may be different from the first optical path 1601.

The roof prism 1610 may be disposed on the second optical path 1602. The roof prism 1610 may be disposed in front of the second reference lens 1210*b*. Light may pass through the roof prism 1610 and be then incident on the second reference lens 1210*b*.

Meanwhile, the plurality of image acquisition regions may include a central region 1141 and a peripheral region 1142.

The central region 1141 may be a region of light having passed through the first reference lens 1210*a*.

The peripheral region 1142 may be a region of light having passed through the roof prism 1610 and the second reference lens 1210*b*.

Meanwhile, the first reference lens 1210*a* may have a predetermined viewing angle in a horizontal direction. The viewing angle of the first reference lens 1210*a* may be defined as a first angle.

Meanwhile, the roof prism 1610 may include a first incidence surface 1611 and a second incidence surface 1612.

A horizontal angle of light entering through the first incidence surface 1611 may be defined as a third angle.

A horizontal angle of light incident through the second entrance may be defined as a fourth angle.

An angle calculated by subtracting the third angle and the fourth angle from the horizontal angle of light incident on the second reference lens 1210*b* may be defined as a second angle.

The first to fourth angles may have relationships as follows.

The first angle may be equal to or greater than the second angle. The third angle may be equal to or greater than the first angle. The fourth angle may be equal to or greater than the first angle. The third angle may be equal to or greater than the fourth angle. The fourth angle may be equal to or greater than the third angle.

An image sensor 814 may include a first image sensor 814*a* and a second image sensor 814*b*.

The first image sensor 814*a* may include a central pixel array. The first image sensor 814*a* may convert first light into an electrical signal.

The first image sensor 814*a* may be disposed on a first plane 1301 on which an image is formed in a central region 1141.

The second image sensor 814*b* may include a peripheral pixel array. The second image sensor 814*b* may convert second light into an electrical signal.

The second image sensor 814*b* may be disposed on a second plane 1302 on which an image is formed in the peripheral region 1142. The second plane 1302 may have a position different from the first plane 1301.

Figure 17:
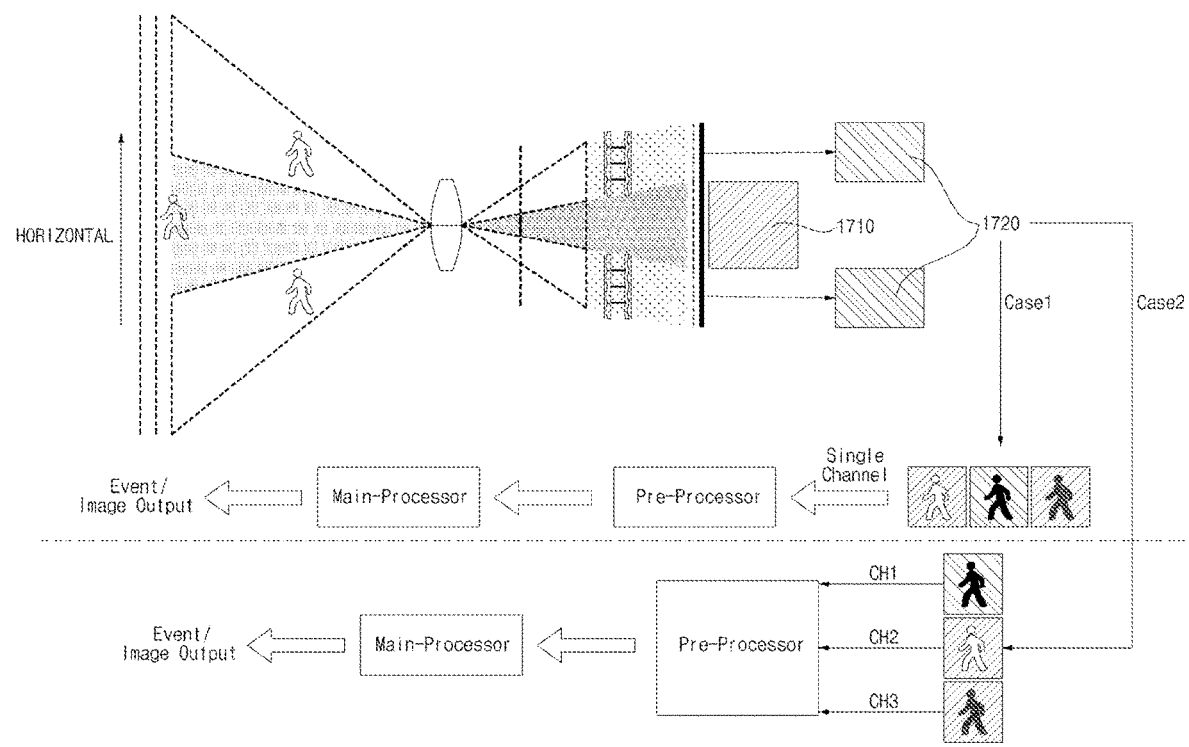
FIG. 17 is a diagram for explanation of a camera apparatus for a vehicle according to an embodiment of the present invention from a processing perspective.

FIG. 17 is a diagram for explanation of a camera apparatus for a vehicle according to an embodiment of the present invention from a processing perspective.

Referring to FIG. 17, a processor 970 may acquire an image 1710 corresponding to a central region. The image 1710 corresponding to the central region may be called a central image.

Here, the central image 1701 may be an image acquired through a central pixel array.

Alternatively, the central image 1701 may be an image acquired by cropping the image.

The processor 970 may acquire an image 1720 corresponding to a peripheral region. The image 1720 corresponding to the peripheral region may be called a peripheral image.

Here, the peripheral image 1720 may be an image acquired through a peripheral pixel array.

Alternatively, the peripheral image 1720 may be an image acquired by cropping the image.

The processor 970 may generate an entire image by re-combining the central image 1710 and the peripheral image 1720.

The processor 970 may perform pre-processing on the re-combined entire image with a single channel and then perform image processing (case 1).

While the central image 1710 and the peripheral image 1720 are not re-combined, the processor 970 may perform pre-processing on the central image 1710 and the peripheral image 1720, respectively, with multiple channels and then perform image processing (case 2).

The present invention as described above may be implemented as code that can be written on a computer-readable medium in which a program is recorded and thus read by a computer. The computer-readable medium includes all kinds of recording devices in which data is stored in a computer-readable manner Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the embodiments set forth herein in all terms, but should be considered by way of example. The scope of the present invention should be determined by the reasonable interpretation of the accompanying claims and all changes in the equivalent range of the present invention are intended to be included in the scope of the present invention.

What is claimed is:

1. A camera apparatus for a vehicle, the apparatus comprising:
a lens unit causing a plurality of image acquisition regions to have different focal lengths, wherein the plurality of image acquisition regions comprises a central region and a peripheral region;
a plurality of pixel arrays corresponding to the plurality of image acquisition regions;
an image sensor configured to convert light incident on each of the plurality of pixel arrays through the lens unit into an electrical signal; and
a processor configured to generate an image based on the electrical signal,
wherein the lens unit comprises a reference lens and a zonal lens interposed between the reference lens and the image sensor, and
wherein a focal length in each of the plurality of image acquisition regions varies according to whether light having passed through the reference lens passes through the zonal lens in a corresponding image acquisition region.

2. The camera apparatus of claim 1,
wherein a focal length of the lens unit in the central region is longer than a focal length of the lens unit in the peripheral region.

3. The camera apparatus of claim 2, wherein a field of view (FOV) in the central region is narrower than an FOV in the peripheral region.

4. The camera apparatus of claim 2, wherein the image sensor comprises:
a central pixel array corresponding to the central region; and
a peripheral pixel array corresponding to the peripheral region.

5. The camera apparatus of claim 2,
wherein an image in the central region is formed on a first plane, and
wherein an image in the peripheral region is formed on a second plane disposed at a position different from a position of the first plane.

6. The camera apparatus of claim 1,
wherein the central region is a region in which light having passed through the reference lens passes through the zonal lens, and
wherein the peripheral region is a region in which the light having passed through the reference lens does not pass through the zonal lens.

7. The camera apparatus of claim 6, wherein the zonal lens causes a focal length of the lens unit in the central region to be longer than a focal length of the lens unit in the peripheral region.

8. The camera apparatus of claim 7, wherein the image sensor is disposed on a first plane on which an image of the central region is formed.

9. The camera apparatus of claim 8, wherein the lens unit further comprises a field lens that transfers an image of a peripheral region formed on a second plane having a position different from a position of the lens unit.

10. The camera apparatus of claim 1,
wherein the central region is a region on which light having passed through the reference lens passes through the zonal lens, and
wherein the peripheral region is a region on which light having passed through the reference lens passes through the zonal lens.

11. The camera apparatus of claim 10, wherein the zonal lens causes a focal length of the lens unit in the peripheral region to be shorter than a focal length of the lens unit in the central region.

12. The camera apparatus of claim 11, wherein the image sensor is disposed on a first plane on which an image of the central region is formed.

13. The camera apparatus of claim 12, further comprising a field lens that transfers an image of the peripheral region formed on the second plane having a position different from a position of the first plane to the image sensor.

14. The camera apparatus of claim 1, wherein the lens unit comprises a beam splitter that splits incident light into first light having a first optical path and second light having a second optical path.

15. The camera apparatus of claim 14, wherein the image sensor comprises:
a first image sensor comprising a central pixel array and configured to convert the first light into an electrical signal; and
a second image sensor comprising a peripheral pixel array and configured to convert the second light into an electrical signal.

16. The camera apparatus of claim 15, wherein the lens unit further comprises an additional lens interposed between the beam splitter and the second image sensor.

17. The camera apparatus of claim 15,
wherein the first image sensor is disposed on a first plane on which an image of the central region is formed, and
wherein the second image sensor is disposed on a second plane on which the image of the peripheral region is formed.

18. The camera apparatus of claim 15,
wherein the processor is further configured to:
crop a portion corresponding to the central region from an image acquired through the first image sensor; and
crop a portion corresponding to the peripheral region from an image acquired through the second image sensor.

19. A vehicle including the camera apparatus according to claim 1.

* * * * *